(12) United States Patent
Park et al.

(10) Patent No.: US 11,189,668 B2
(45) Date of Patent: Nov. 30, 2021

(54) DISPLAY APPARATUS

(71) Applicant: Samsung Display Co., Ltd., Yongin-si (KR)

(72) Inventors: Hyungjun Park, Yongin-si (KR); Wonkyu Kwak, Yongin-si (KR); Jintae Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/855,525

(22) Filed: Apr. 22, 2020

(65) Prior Publication Data

US 2020/0403040 A1     Dec. 24, 2020

(30) Foreign Application Priority Data

Jun. 18, 2019  (KR) .................. 10-2019-0072424

(51) Int. Cl.
*H01L 27/32*      (2006.01)
*H01L 51/50*      (2006.01)
*H01L 51/52*      (2006.01)

(52) U.S. Cl.
CPC ........ *H01L 27/323* (2013.01); *H01L 27/3262* (2013.01); *H01L 27/3265* (2013.01); *H01L 51/5056* (2013.01); *H01L 51/5072* (2013.01); *H01L 51/5092* (2013.01); *H01L 51/5284* (2013.01); *H01L 51/5293* (2013.01); *H01L 2251/301* (2013.01)

(58) Field of Classification Search
CPC .............. H01L 27/323; H01L 27/3265; H01L 27/3262; H01L 51/5056; H01L 51/5072; H01L 51/5284; H01L 51/5293; H01L 51/5092; H01L 2251/301
See application file for complete search history.

(56) References Cited

U.S. PATENT DOCUMENTS

| | | | |
|---|---|---|---|
| 10,748,974 B2* | 8/2020 | Lee | G06F 1/1686 |
| 2007/0242196 A1* | 10/2007 | Yoshida | G02F 1/133371 349/114 |
| 2017/0237038 A1* | 8/2017 | Kim | H01L 51/5253 257/40 |
| 2019/0131572 A1* | 5/2019 | Gwon | G09G 3/3225 |
| 2019/0334120 A1* | 10/2019 | Seo | H01L 51/5246 |
| 2020/0006701 A1* | 1/2020 | Lee | H01L 27/3227 |
| 2020/0159356 A1 | 5/2020 | Tada et al. | |
| 2020/0303677 A1 | 9/2020 | Lee et al. | |

FOREIGN PATENT DOCUMENTS

| | | |
|---|---|---|
| EP | 3657561 A1 | 5/2020 |
| EP | 3706176 A1 | 9/2020 |
| WO | 2019/031579 A1 | 2/2019 |

* cited by examiner

*Primary Examiner* — Kyoung Lee
*Assistant Examiner* — Christina A Sylvia
(74) *Attorney, Agent, or Firm* — Lewis Roca Rothgerber Christie LLP

(57) ABSTRACT

A display apparatus includes: a display panel comprising a transmission area, a display area, and a middle area that includes at least one groove and is located between the transmission area and the display area; an input sensing layer stacked on the display panel, wherein a metal layer that overlaps the at least one groove in a plan view is in one of the display panel and the input sensing layer.

20 Claims, 39 Drawing Sheets

DISPLAY APPARATUS

CROSS-REFERENCE TO RELATED APPLICATION

The present application claims priority to and the benefit of Korean Patent Application No. 10-2019-0072424, filed on Jun. 18, 2019, in the Korean Intellectual Property Office, the disclosure of which is incorporated herein in its entirety by reference.

BACKGROUND

1. Field

Aspects of one or more example embodiments relate to a display panel including a first area inside a display area, and a display apparatus including the display panel.

2. Description of Related Art

Applications of display apparatuses have recently diversified. Moreover, because display apparatuses have become thinner and lighter, their range of use has increased.

The area occupied by a display area of display apparatuses has increased, and also various functions that may be applied or linked to display apparatuses have been added to display apparatuses. To increase the area occupied by a display area and also add various functions, research has been carried out on display apparatuses capable of having various components arranged in a display area.

The above information disclosed in this Background section is only for enhancement of understanding of the background and therefore the information discussed in this Background section does not necessarily constitute prior art.

SUMMARY

Aspects of one or more example embodiments include a display panel having, within a display area, a transmission area where various sorts of components may be arranged, and a display apparatus including the display panel. However, the one or more embodiments described herein are only examples, and the scope of the disclosure is not limited thereto.

According to one or more example embodiments, a display apparatus includes: a display panel including a transmission area, a display area, and a middle area including at least one groove and located between the transmission area and the display area; and an input sensing layer stacked on the display panel, wherein a metal layer that overlaps the at least one groove according to a planar view is included in one of the display panel and the input sensing layer.

According to some example embodiments, in the display area, a thin-film transistor including a semiconductor layer, a gate electrode, a source electrode, and a drain electrode and connected to a display element, and a storage capacitor including a lower electrode and an upper electrode facing each other with an insulating layer therebetween may be included, wherein the gate electrode is used as the lower electrode. The metal layer may include a same material as a material included in one of the gate electrode and the upper electrode, and may be arranged on a same layer as a layer on which one of the gate electrode and the upper electrode is arranged.

According to some example embodiments, the metal layer may be a continuous layer extending without disconnection.

According to some example embodiments, the metal layer may be a segmented layer having a gap of 3 µm or less according to a planar view.

According to some example embodiments, the segmented layer may include a single-layered segmented layer on the same layer as the layer on which one of the gate electrode and the upper electrode is arranged, or a multi-layered segmented layer in which multiple layers are on different layers such that one layer alternates with another layer with the gap.

According to some example embodiments, the input sensing layer may include a lower sensing electrode and an upper sensing electrode facing each other with an insulating layer therebetween, and the metal layer may include a same material as a material included in one of the lower sensing electrode and the upper sensing electrode and may be arranged on a same layer as a layer on which one of the lower sensing electrode and the upper sensing electrode is arranged.

According to some example embodiments, the metal layer may be a continuous layer extending without disconnection.

According to some example embodiments, the metal layer may be a segmented layer having a gap of 3 µm or less according to a planar view.

According to some example embodiments, the segmented layer may include a single-layered segmented layer on the same layer as the layer on which one of the lower sensing electrode and the upper sensing electrode is arranged, or a multi-layered segmented layer in which multiple layers are on different layers such that one layer alternates with another layer with the gap.

According to some example embodiments, the display apparatus may further include a window that covers the display panel and the input sensing layer from outside; and an optical functional layer between the display panel and the window.

According to some example embodiments, the optical functional layer may include a anti-reflection layer using polarization, and a black matrix for blocking light may not be provided in a portion of the window that corresponds to the middle area.

According to some example embodiments, the display area may include, on a substrate, a display element in which a pixel electrode, an intermediate layer including an emission layer, and an opposite electrode are stacked, and a multi-layered film in which an inorganic insulating layer, an organic insulating layer, and an inorganic layer are sequentially stacked between the substrate and the pixel electrode, and the middle area may include an inorganic contact region where the inorganic layer and the inorganic insulating layer directly contact each other through an opening included in the organic insulating layer to be adjacent to each of the at least one groove.

According to some example embodiments, the inorganic layer may be located to not overlap with each of the at least one groove according to a planar view, and the metal layer may cover a portion of the middle area not covered by the inorganic layer according to a planar view, including each of the at least one groove.

According to some example embodiments, each of the at least one groove may include a first hole that penetrates through the inorganic layer; and a second hole or a recess that penetrates through the organic insulating layer.

According to some example embodiments, the multi-layered film may further include a lower insulating layer under the organic insulating layer, and each of the at least one groove may include a first hole that penetrates through the inorganic layer; a second hole that penetrates through the organic insulating layer; and a third hole or a recess that penetrates through the lower insulating layer.

According to some example embodiments, the multi-layered film may further include at least one upper insulating layer over the organic insulating layer, and the at least one upper insulating layer may include a hole that overlaps with each of the at least one groove.

According to some example embodiments, the at least one upper insulating layer may include an inorganic insulating layer and/or an organic insulating layer.

According to some example embodiments, the intermediate layer may include one or more organic material layer from among a hole transport layer, a hole injection layer, an electron injection layer, and an electron transport layer.

According to some example embodiments, the at least one groove may include a plurality of grooves spaced apart from each other, and the inorganic contact region may be between the plurality of grooves.

According to some example embodiments, each of the at least one groove may have an undercut structure.

These and/or other aspects will become more apparent and more readily appreciated from the following description of the example embodiments, taken in conjunction with the accompanying drawings.

DETAILED DESCRIPTION

Figure 1:
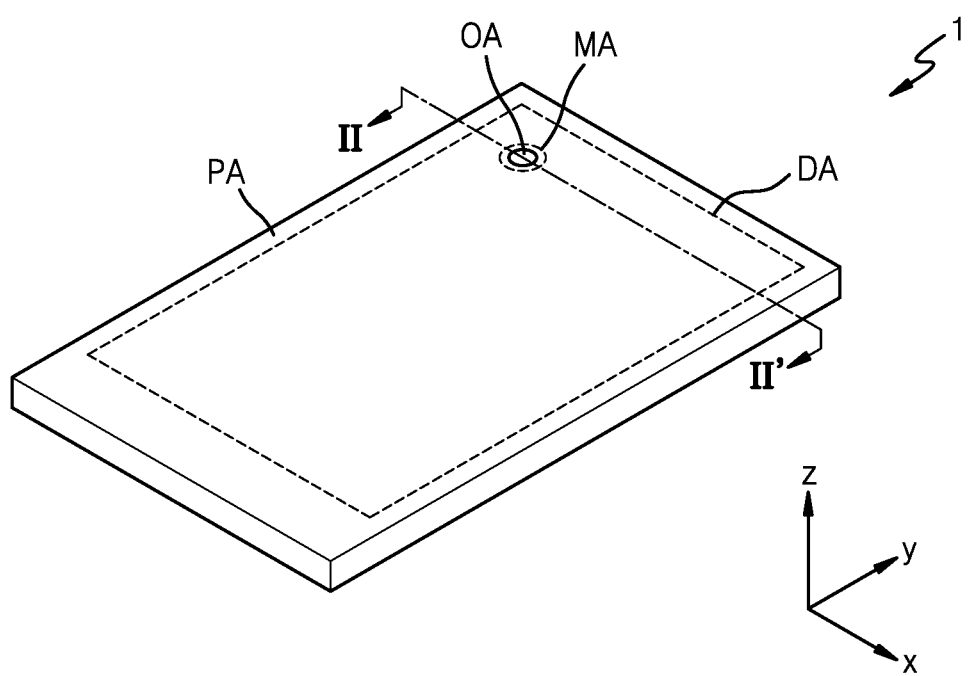
FIG. 1 is a schematic perspective view of a display apparatus according to some example embodiments.

Reference will now be made in more detail to aspects of some example embodiments, which are illustrated in the accompanying drawings, wherein like reference numerals refer to like elements throughout. In this regard, the embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following example embodiments are not limited thereto.

When a certain example embodiment may be implemented differently, a specific process order may be performed differently from the described order. For example, two consecutively described processes may be performed substantially at the same time or performed in an order opposite to the described order.

In the present specification, "A and/or B" represents A or B, or A and B.

It will also be understood that when a layer, region, or component is referred to as being "connected" or "coupled" to another layer, region, or component, it can be directly connected or coupled to the other layer, region, or component or intervening layers, regions, or components may be present. For example, when a layer, region, or component is referred to as being "electrically connected" or "electrically coupled" to another layer, region, or component, it can be directly electrically connected or coupled to the other layer, region, or component or intervening layers, regions, or components may be present.

FIG. 1 is a schematic perspective view of a display apparatus 1 according to some example embodiments.

Referring to FIG. 1, the display apparatus 1 includes a first area OA and a display area DA. The display area DA is a second area at least partially surrounding the first area OA. The display apparatus 1 may provide a certain image by using light emitted from a plurality of pixels arranged in the display area DA. It is shown in FIG. 1 that one first area OA is arranged inside the display area DA, and the first area OA may be entirely surrounded by the display area DA. The first area OA may be an area where a component to be described later with reference to FIG. 2 is arranged.

A middle area MA may be arranged as a third area between the first area OA and the display area DA, which is the second area. The display area DA may be surrounded by a peripheral area PA, which is a fourth area. The middle area MA and the peripheral area PA may be non-display areas in which pixels are not arranged. The middle area MA may be entirely surrounded by the display area DA, and the display area DA may be entirely surrounded by the peripheral area PA.

Although an organic light-emitting display will now be illustrated and described as the display apparatus 1, the display apparatus 1 is not limited thereto. According to some example embodiments, a display apparatus, such as a quantum dot light-emitting display, may be used.

Although the single first area OA is included and is approximately circular in FIG. 1, embodiments are not limited thereto. The number of first areas OA may be two or more, and a shape of each of the first areas OA may be a circular shape, an elliptical shape, a polygonal shape, a star shape, a diamond shape, or the like.

Figure 2A:
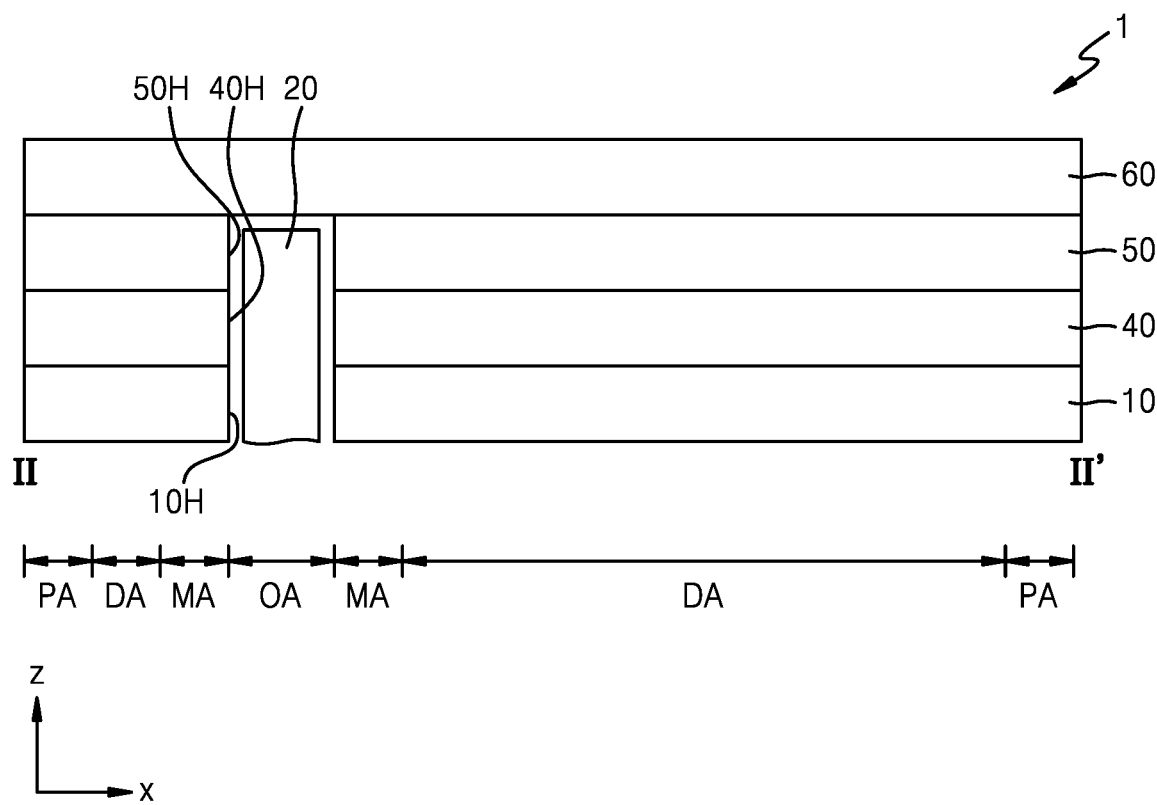
FIGS. 2A and 2B are schematic cross-sectional views of a display apparatus according to some example embodiments.
Figure 2B:
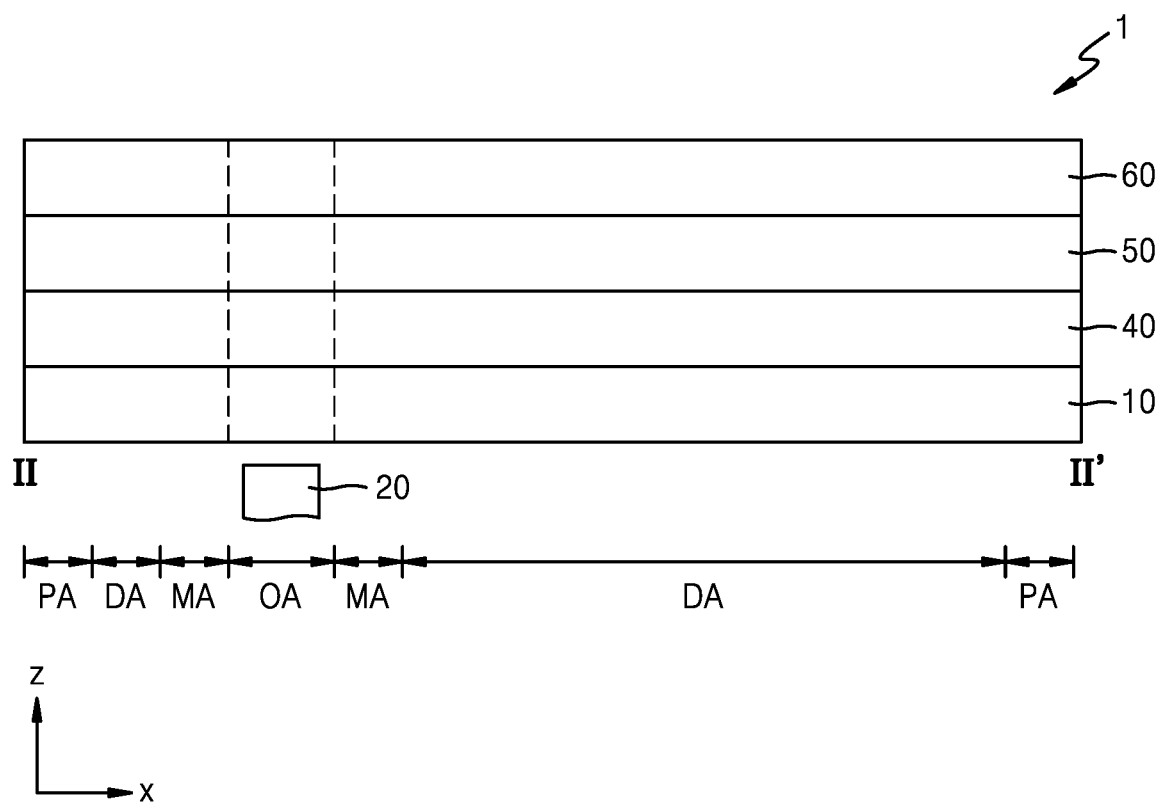

FIGS. 2A and 2B are schematic cross-sectional views of the display apparatus 1 according to some example embodiments, and may correspond to cross-sections taken along the line II-II' of FIG. 1.

Referring to FIG. 2A, the display apparatus 1 may include a display panel 10, an input sensing layer 40, and an optical functional layer 50 sequentially arranged on the display panel 10. These layers may be covered by a window 60. The display apparatus 1 may be any of various electronic apparatuses such as mobile phones, notebook computers, and smartwatches.

The display panel 10 may display an image. The display panel 10 includes pixels arranged in the display area DA. Each of the pixels may include a display element, and a pixel circuit connected to the display element. The display element may include an organic light-emitting diode, a quantum dot organic light-emitting diode, or the like.

The input sensing layer 40 obtains coordinate information corresponding to an external input, for example, a touch event. The input sensing layer 40 may include a sensing electrode (or a touch electrode) and trace lines connected to the sensing electrode. The input sensing layer 40 may be arranged on the display panel 10. The input sensing layer 40 may sense an external input according to a mutual cap method and/or a self cap method.

The input sensing layer 40 may be directly formed on the display panel 10, or may be formed separately and then coupled to the display panel 10 by using an adhesive layer such as an optical clear adhesive. For example, the input sensing layer 40 may be successively formed after a process of forming the display panel 10. In this case, the input sensing layer 40 may be understood as a portion of the display panel 10, and no adhesive layers may be arranged between the input sensing layer 40 and the display panel 10. FIG. 2A shows that the input sensing layer 40 is between the display panel 10 and the optical functional layer 50. However, according to some example embodiments, the input sensing layer 40 may be on the optical functional layer 50.

The optical functional layer 50 may include an anti-reflection layer. The anti-reflection layer may reduce reflectivity of light (external light) incident from the outside toward the display panel 10 through the window 60. The anti-reflection layer may include a phase retarder and a polarizer The phase retarder may be of a film type or liquid coating type, and may include a $\lambda/2$ phase retarder and/or a $\lambda/4$ phase retarder. The polarizer may also be of a film type or liquid coating type. The film type polarizer may include a stretchable synthetic resin film, and the liquid coating type polarizer may include liquid crystals arranged in a predetermined arrangement. The phase retarder and the polarizer may further include protective films, respectively. The protective films of the phase retarder and the polarizer may be defined as a base layer of the anti-reflection layer.

According to some example embodiments, the anti-reflection layer may include a black matrix and color filters. The color filters may be arranged by taking into account the colors of light beams emitted by the pixels of the display panel 10. According to some example embodiments, the anti-reflection layer may include a destructive interference structure. The destructive interference structure may include a first reflection layer and a second reflection layer arranged on different layers. First reflected light and second reflected light respectively reflected by the first reflection layer and the second reflection layer may be destructively interfered with each other, and thus the reflectance of external light may be reduced.

The optical functional layer 50 may include a lens layer. The lens layer may improve the emission efficiency or reduce color deviation of light emitted from the display panel 10. The lens layer may include a layer having a concave or convex lens shape, and/or include a plurality of layers respectively having different refractive indexes. The optical functional layer 50 may include both the anti-reflection layer and the lens layer, or include one of the anti-reflection layer and the lens layer.

According to some example embodiments, the optical functional layer 50 may be successively formed after a process of forming the display panel 10 and/or the input sensing layer 40. In this case, no adhesive layers may be arranged between the optical function layer 50 and the input sensing layer 40 and/or the display panel 10.

The display panel 10, the input sensing layer 40, and/or the optical functional layer 50 may include an opening. With regard to this, it is shown in FIG. 2A that the display panel 10, the input sensing layer 40, and the optical functional layer 50 respectively include first, second, and third openings 10H, 40H, and 50H and that the first, second, and third openings 10H, 40H, and 50H overlap each other. The first, second, and third openings 10H, 40H, and 50H are located to correspond to the first area OA. According to some example embodiments, at least one from among the display panel 10, the input sensing layer 40, and the optical functional layer 50 may not include an opening. For example, one or two selected from the display panel 10, the input sensing layer 40, and the optical functional layer 50 may not include an opening. Alternatively, as shown in FIG. 2B, the display panel 10, the input sensing layer 40, and the optical functional layer 50 may include no openings.

The first area OA may be a kind of component area (e.g. a sensor area, a camera area, a speaker area, or the like) in which a component 20 for adding various functions to the display apparatus 1 is located. As shown in FIG. 2A, the component 20 may be located in the first, second, and third openings 10H, 40H, and 50H. Alternatively, as shown in FIG. 2B, the component 20 may be located below the display panel 10.

The component 20 may include an electronic element. For example, the component 20 may be an electronic element that uses light or sounds. For example, the electronic element may include a sensor that outputs or/and receives light, like an infrared sensor, a camera that receives light and captures an image, a sensor that outputs and senses light or sound to measure a distance or recognize a fingerprint, a small lamp that outputs light, or a speaker that outputs sound. An electronic element using light may use light in various wavelength bands, such as visible light, infrared light, and ultraviolet light. According to some embodiments, the first area OA may be understood as a transmission area capable of transmitting light or/and sound that is output from the component 20 to the outside or travels from the outside toward the component 20.

According to some example embodiments, when the display apparatus 1 is used as a smartwatch or an instrument panel for automobiles, the component 20 may be a member such as a needle of a clock or a needle indicating predetermined information (e.g. a velocity of a vehicle, etc.). When the display apparatus 1 includes a needle of a clock or an instrument panel for automobiles, the component 20 may be exposed to the outside through the window 60, and the window 60 may include an opening corresponding to the first area OA.

As described above, the component 20 may include an element(s) related to a function of the display panel 10 or may include an element such as an accessory that increases an esthetic sense of the display panel 10. Although not shown in FIGS. 2A and 2B, an optical clear adhesive, etc. may be located between the window 60 and the optical functional layer 50.

FIGS. 3A through 3D are schematic cross-sectional views of the display panel 10 according to an embodiment.

Figure 3A:
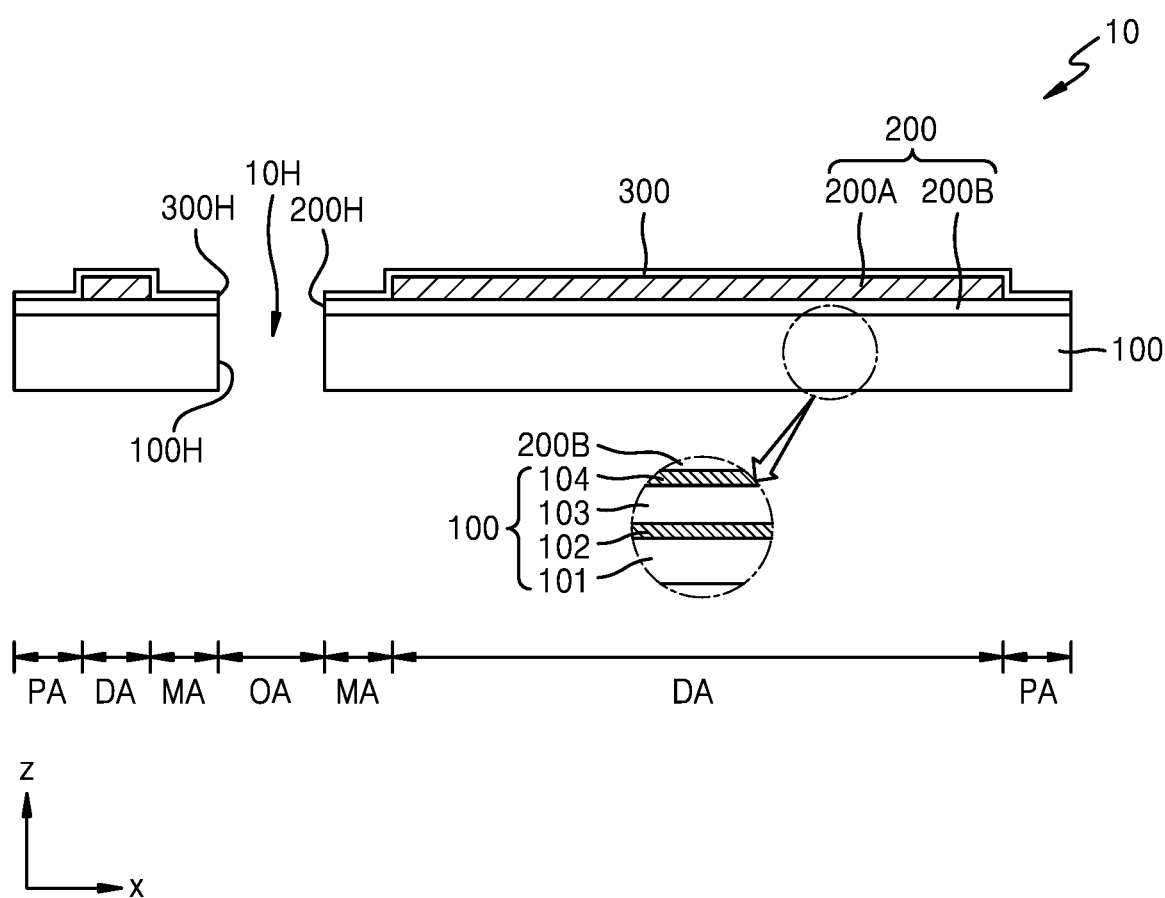
FIGS. 3A through 3D are schematic cross-sectional views of a display panel according to some example embodiments.

Referring to FIG. 3A, the display panel 10 includes a display layer 200 located on a substrate 100. The substrate 100 may include a glass material or may include polymer resin. The substrate 100 may have a multi-layer structure. For example, as shown in an enlarged view of FIG. 3A, the substrate 100 may include a first base layer 101, a first barrier layer 102, a second base layer 103, and a second barrier layer 104.

Each of the first and second base layers 101 and 103 may include polymer resin. For example, the first and second base layers 101 and 103 may include copolymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), or cellulose acetate propionate (CAP). The aforementioned polymer resin may be transparent.

Each of the first and second barrier layers 102 and 104 is a barrier layer that prevents infiltration of external foreign materials, and thus may be a single layer or multiple layers including an inorganic material, such as silicon nitride ($SiN_x$, x>0) or silicon oxide ($SiO_x$, x>0).

The display layer 200 includes a plurality of pixels. The display layer 200 may include a display element layer 200A and a pixel circuit layer 200B. The display element layer 200A may include display elements respectively arranged in the pixels, and the pixel circuit layer 200B may include insulating layers and a pixel circuit arranged in each pixel. Each pixel circuit may include a thin-film transistor and a storage capacitor, and each display element may include an organic light-emitting diode OLED.

The display elements of the display layer 200 may be covered by an encapsulation member such as a thin-film encapsulation layer 300. The thin-film encapsulation layer 300 may include at least one inorganic encapsulation layer and at least one organic encapsulation layer. When the display panel 10 includes the substrate 100 including a polymer resin, and the thin-film encapsulation layer 300 including an inorganic encapsulation layer and an organic encapsulation layer, the flexibility of the display panel 10 may be improved.

Figure 3B:
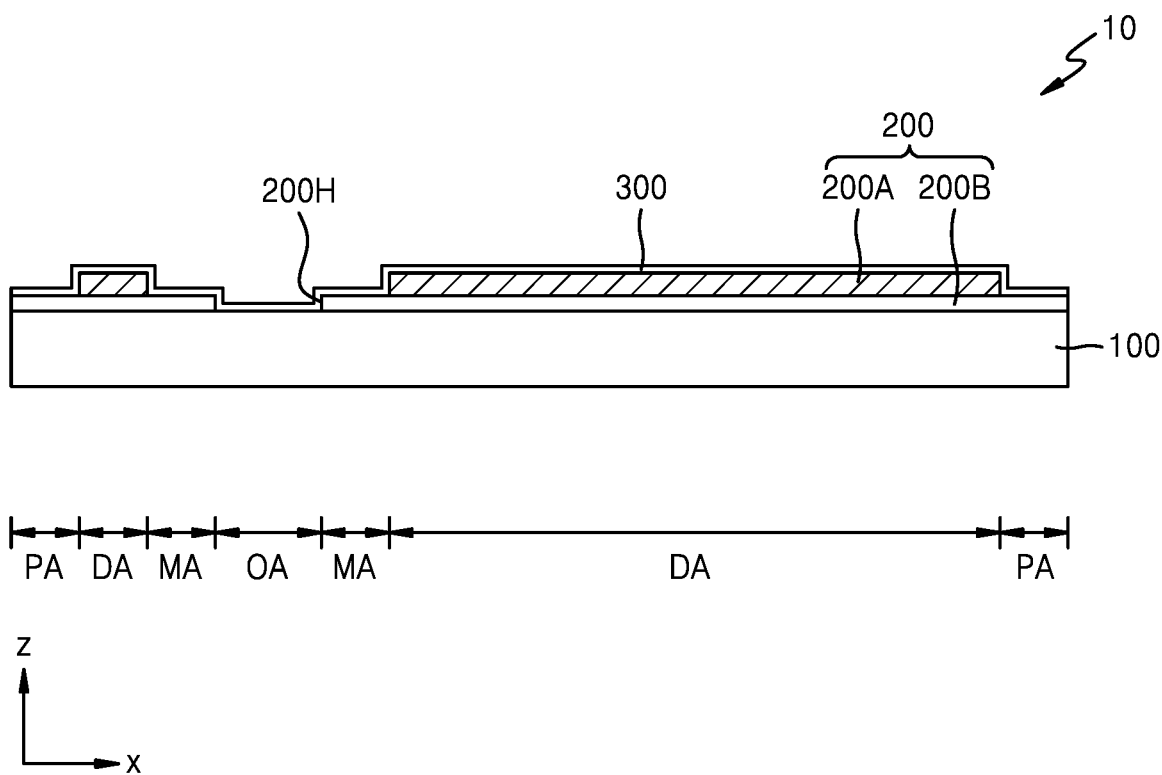

The display panel 10 may include the first opening 10H that penetrates through the display panel 10. The first opening 10H may be located in the first area OA. In this case, the first area OA may be a kind of opening area. It is shown in FIG. 3A that the substrate 100 and the thin-film encapsulation layer 300 respectively include through holes 100H and 300H, each corresponding to the first opening 10H of the display panel 10. The display layer 200 may include a through hole 200H corresponding to the first area OA According to some example embodiments, as shown in FIG. 3B, the substrate 100 may not include a through hole corresponding to the first area OA. The display layer 200 may include the through hole 200H corresponding to the first area OA The thin-film encapsulation layer 300 may not include a through hole corresponding to the first area OA. According to some example embodiments, as shown in FIG. 3C, the display layer 200 may not include the through hole 200H corresponding to the first area OA, and the display element layer 200A may not be located in the first area OA.

Figure 3C:
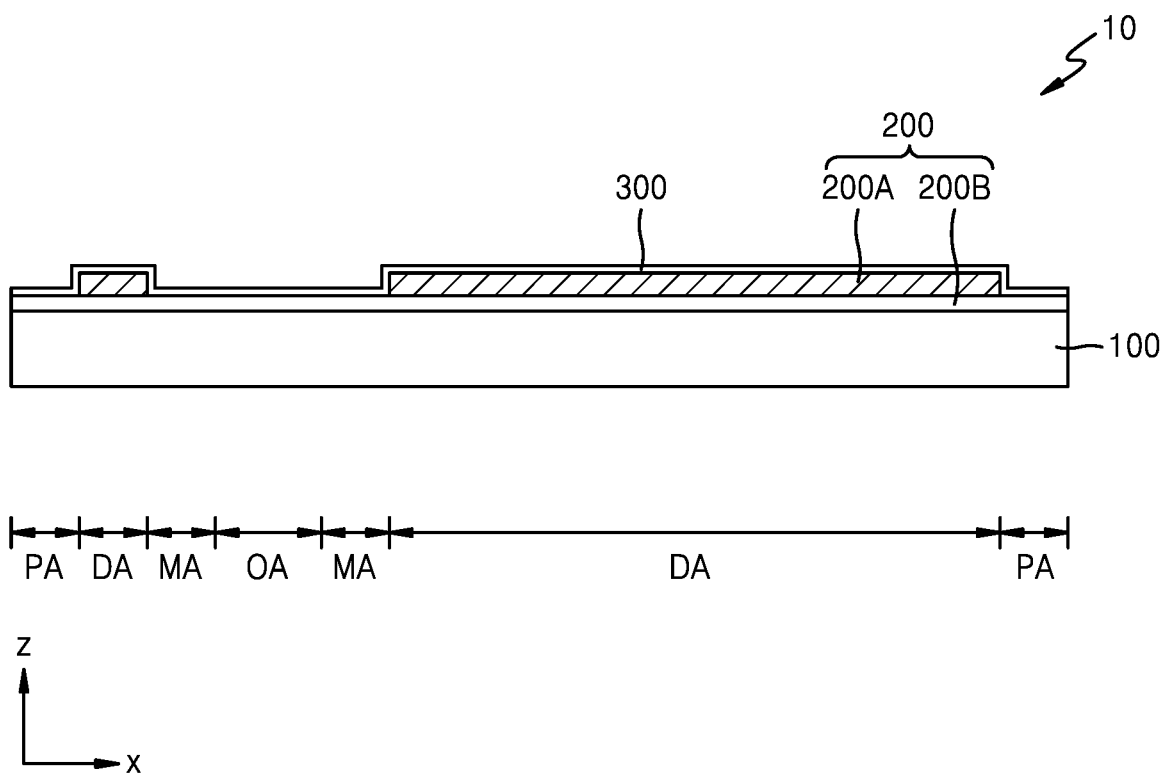
Figure 3D:
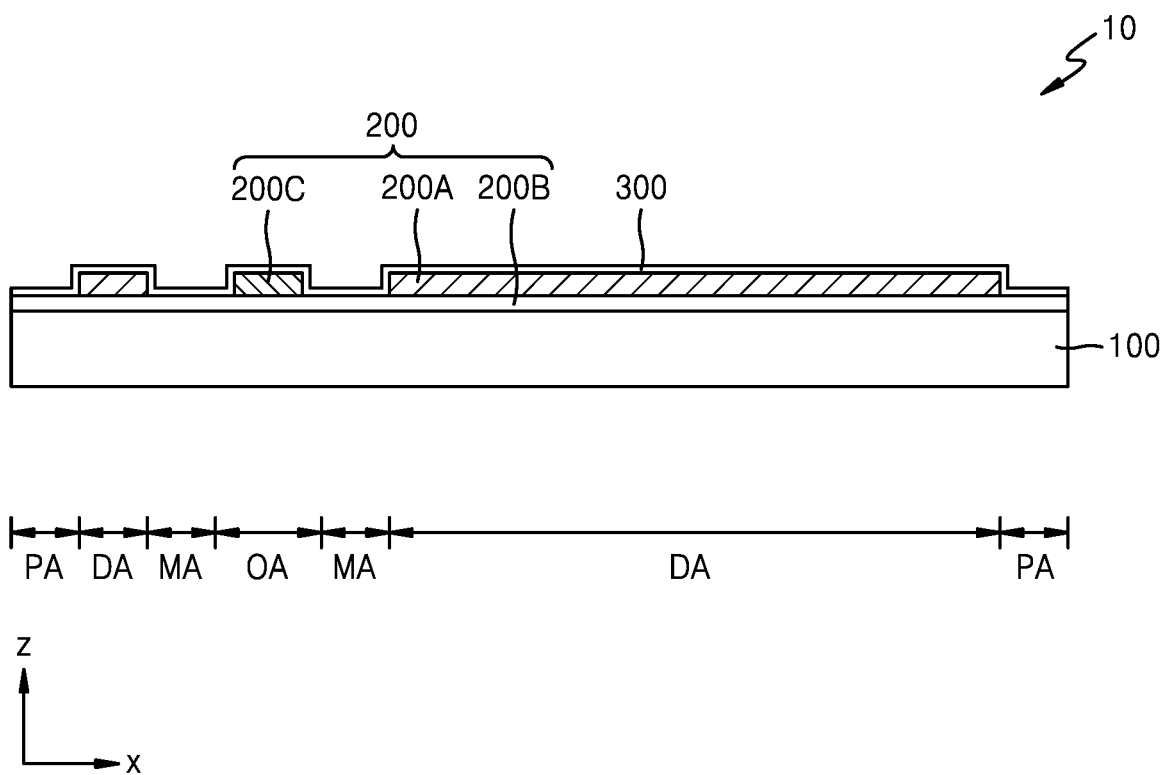

Although it is shown in FIGS. 3A through 3C that the display element layer 200A is not arranged in the first area OA, the present disclosure is not limited thereto. According to some example embodiments, as shown in FIG. 3D, an auxiliary display element layer 200C may be located in the first area OA. The auxiliary display element layer 200C may include a display element having a different structure from the display element of the display element layer 200A and/or operating in a different way from the display element of the display element layer 200A.

According to some example embodiments, the display element layer 200A may include pixels, each including an active organic light-emitting diode, and the auxiliary display element layer 200C may include pixels, each including a passive organic light-emitting diode. When the auxiliary display element layer 200C includes a passive organic light-emitting diode as a display element, there may be no elements constituting a pixel circuit below the corresponding passive organic light-emitting diode. For example, a portion of the pixel circuit layer 200B that is under the auxiliary display element layer 200C includes no transistors and no storage capacitors.

According to some example embodiments, the auxiliary display element layer 200C may include the same type of display element (e.g. an active organic light-emitting diode) as the display element of the display element layer 200A, but a pixel circuit below the auxiliary display element layer 200C may have a different structure from that of the display element layer 200A. For example, the pixel circuit (e.g. a pixel circuit including a light-blocking layer between a substrate and a transistor) below the auxiliary display element layer 200C may include a different structure from that below the display element layer 200A. Alternatively, display elements of the auxiliary display element layer 200C may operate according to a different control signal from that for the display elements of the display element layer 200A. A component (e.g. an infrared sensor) that does not require a relatively high transmittance may be arranged in the first area OA in which the auxiliary display element layer 200C is arranged. In this case, the first area OA may be understood as both a component area and an auxiliary display area.

FIGS. 4A through 4D are schematic cross-sectional views of a display panel 10' according to another embodiment. Unlike the display panel 10 described with reference to FIGS. 3A through 3D that includes the thin-film encapsulation layer 300, the display panel 10' of FIGS. 4A through 4D may include an encapsulation substrate 300A and a sealant 340.

Figure 4A:
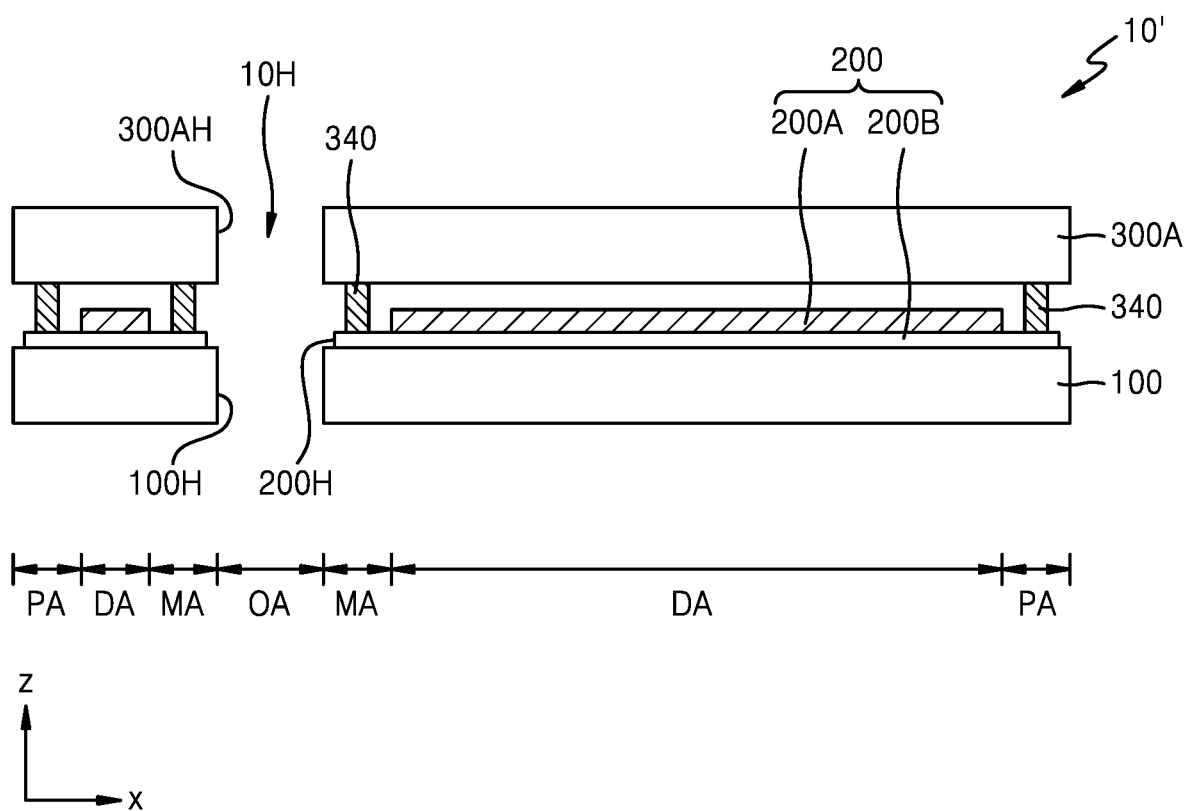
FIGS. 4A through 4D are schematic cross-sectional views of a display panel according to some example embodiments.
Figure 4B:
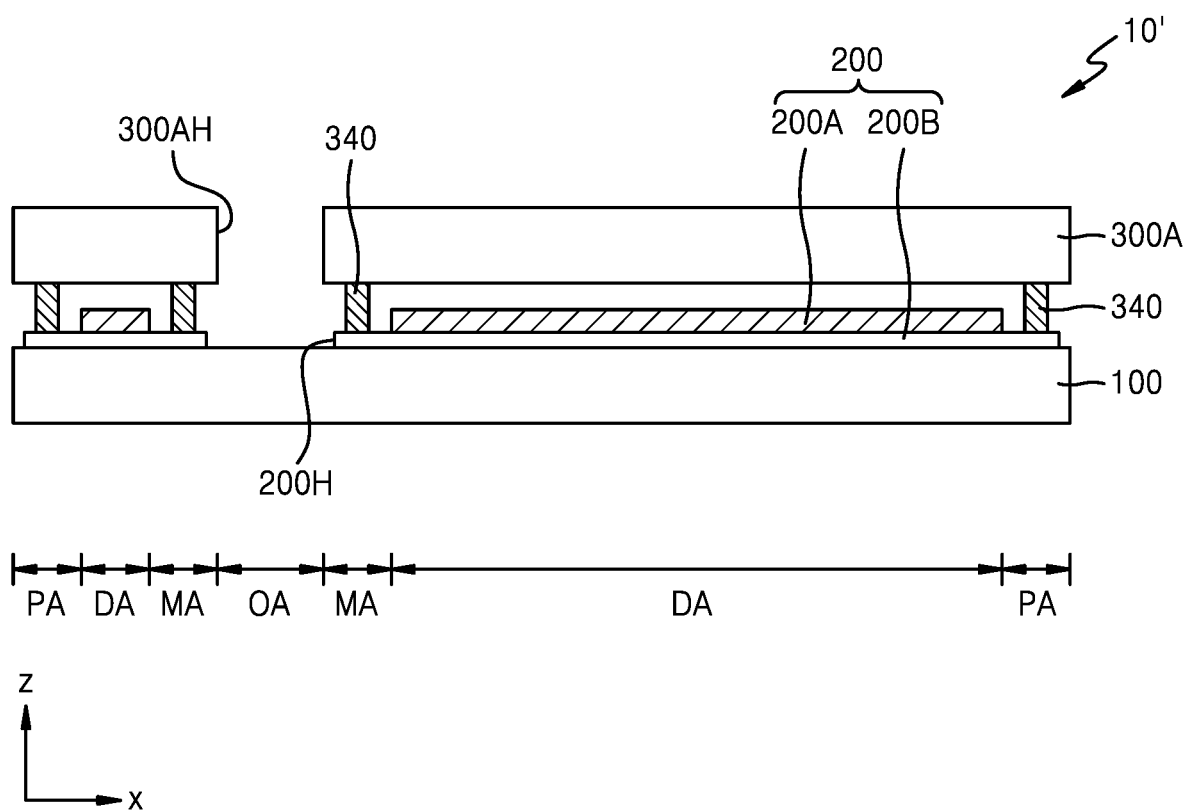
Figure 4C:
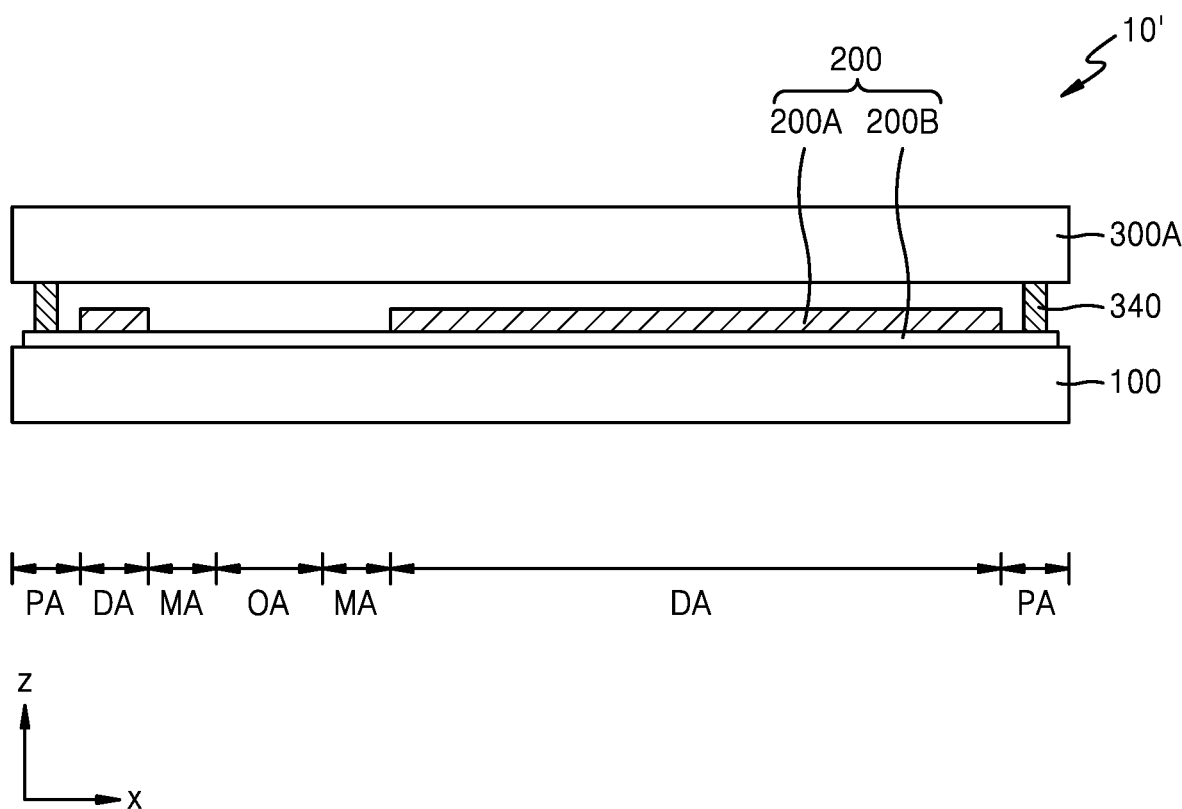
Figure 4D:
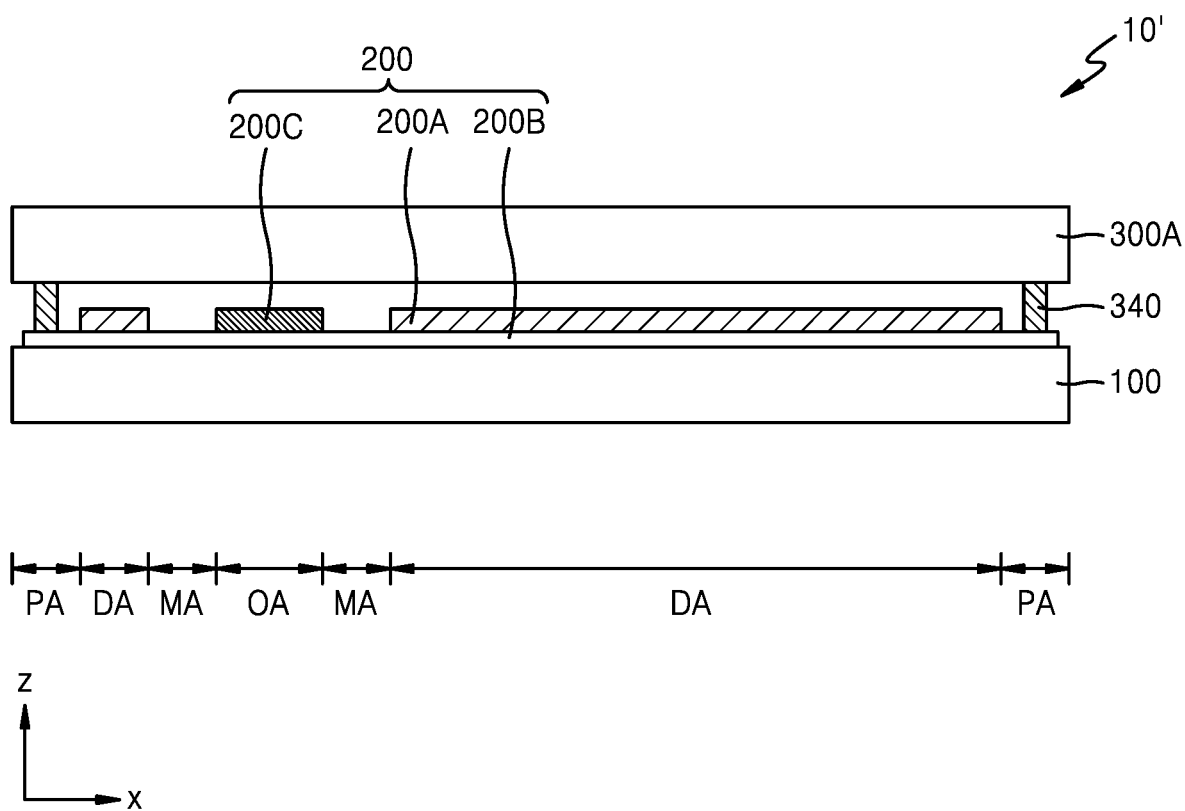

As shown in FIGS. 4A through 4C, at least one selected from the substrate 100, the display layer 200, and the encapsulation substrate 300A may include through holes 100H, 200H, and 300AH corresponding to the first area OA. The display element layer 200A may not be arranged in the first area OA, or as shown in FIG. 4D, the auxiliary display element layer 200C may be arranged in the first area OA. The auxiliary display element layer 200C is the same as that described with reference to FIG. 3D.

Figure 5A:
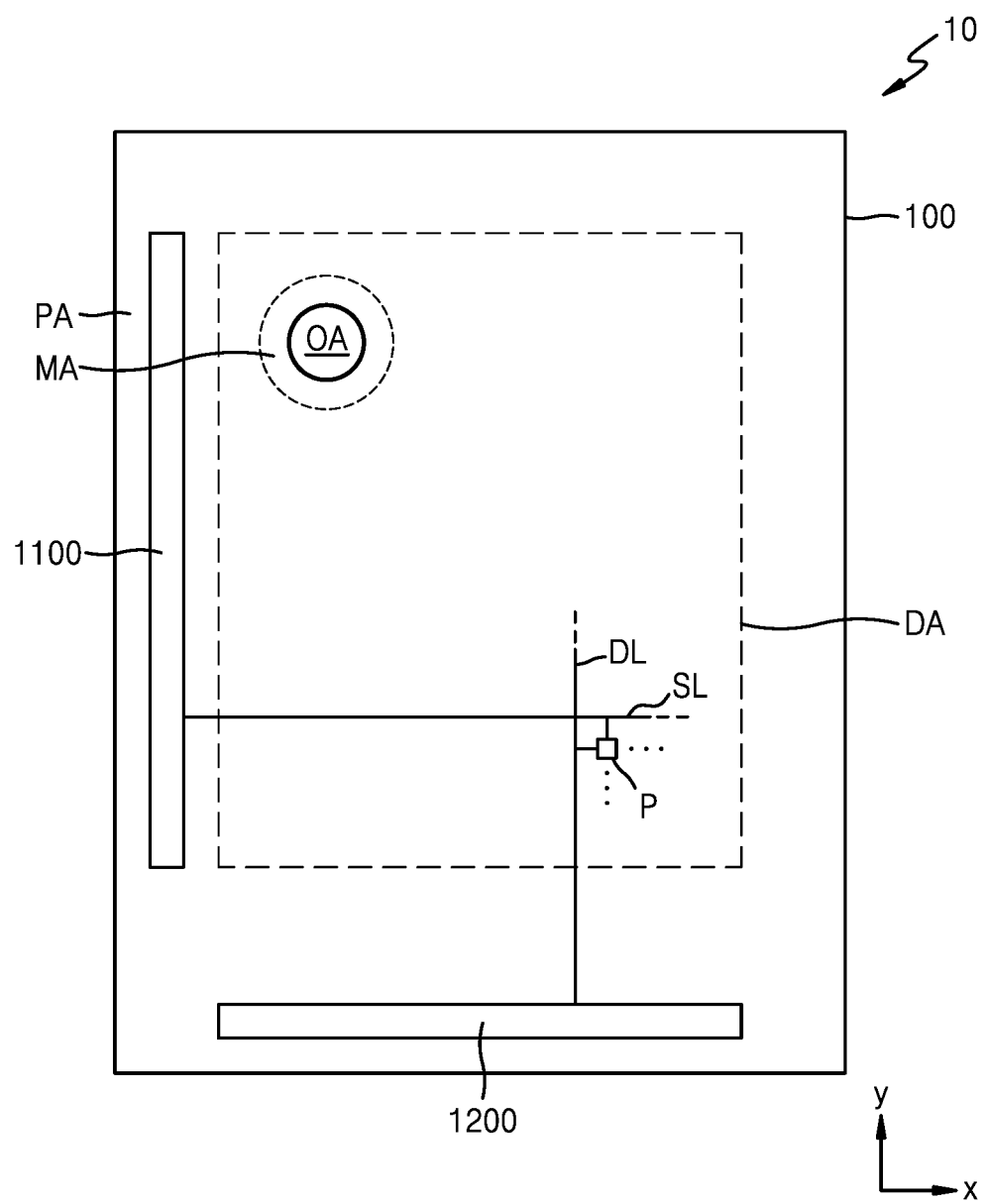
FIGS. 5A and 5B are schematic plan views of a display panel according to some example embodiments.
Figure 5B:
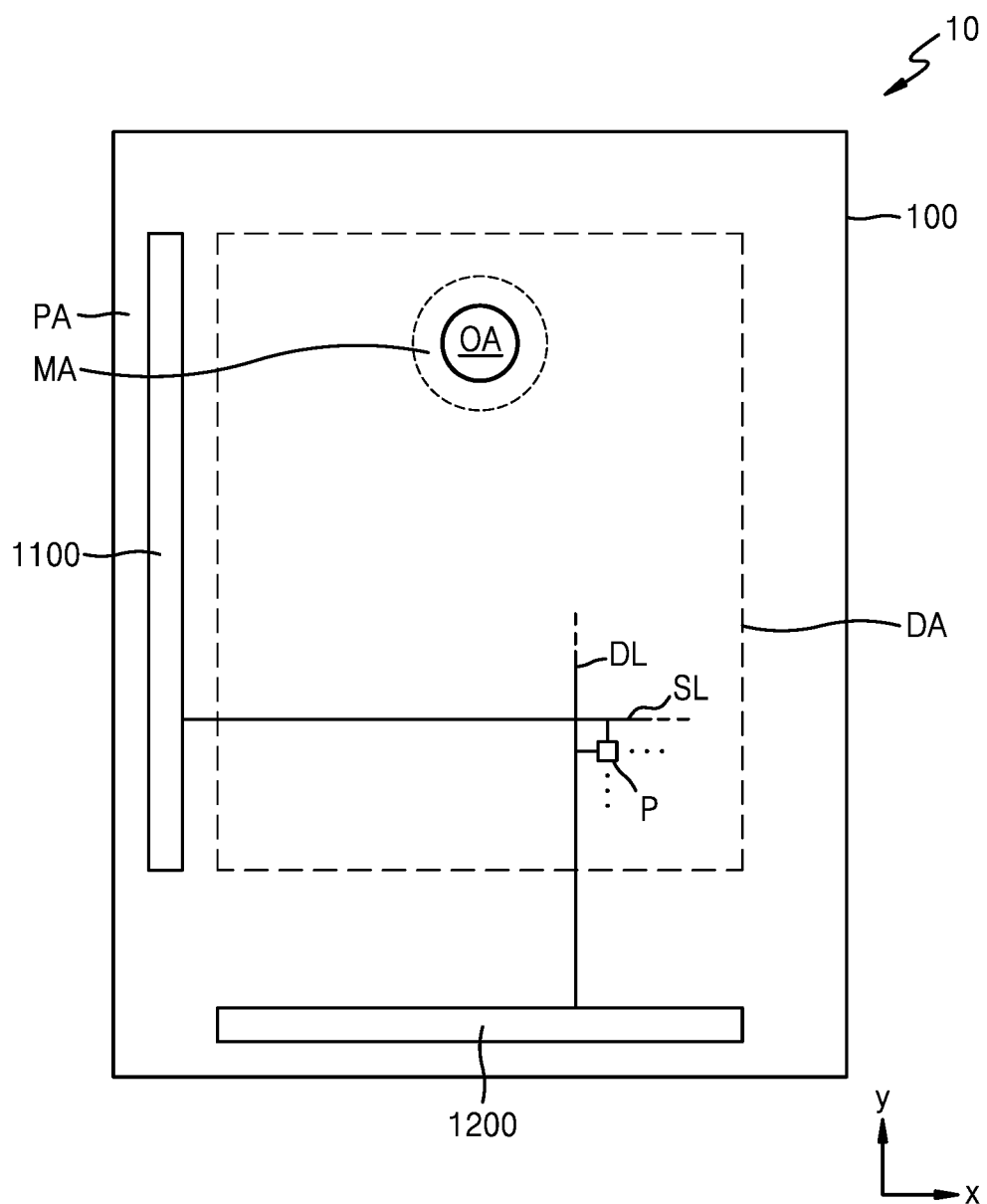
Figure 6:
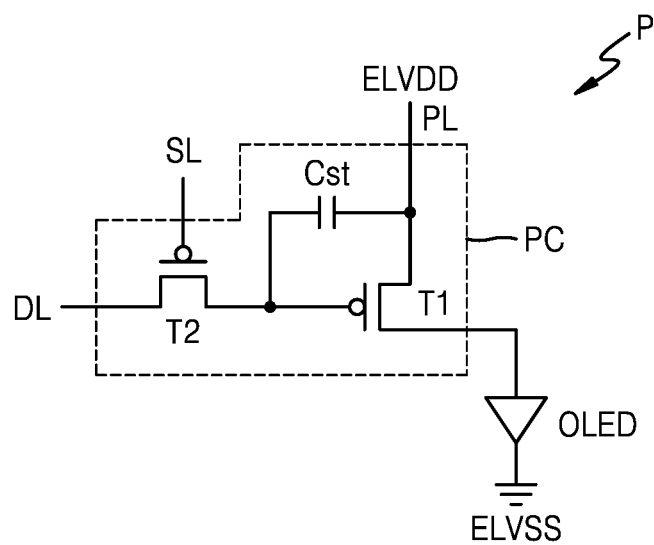
FIG. 6 is a schematic equivalent circuit diagram of one pixel within a display panel according to some example embodiments.

FIGS. 5A and 5B are schematic plan views of the display panel 10 according to some example embodiments, and FIG. 6 is an equivalent circuit diagram of one of the pixels of the display panel 10 according to an embodiment.

Referring to FIG. 5A, the display panel 10 may include the first area OA, the display area DA (which is the second area), the middle area MA (which is the third area), and the peripheral area PA (which is the fourth area). FIG. 5A may be understood as a figure of the substrate 100 of the display panel 10. For example, the substrate 100 may be understood as having the first area OA, the display area DA, the middle area MA, and the peripheral area PA.

The display panel 10 includes a plurality of pixels P arranged in the display area DA. A shown in FIG. 6, each of the pixels P may include a pixel circuit PC and an organic light-emitting diode OLED as a display element connected to the pixel circuit PC. The pixel circuit PC may include a first thin-film transistor T1, a second thin-film transistor T2, and a storage capacitor Cst. Each of the pixels P may emit, for example, red light, green light, or blue light, or may emit red light, green light, blue light, or white light, via the organic light-emitting diode OLED.

The second thin-film transistor T2, which is a switching thin-film transistor, may be connected to a scan line SL and a data line DL, and transmit, to the first thin-film transistor T1, a data voltage received via the data line DL, based on a switching voltage received via the scan line SL. The storage capacitor Cst may be connected to the second thin-film transistor T2 and a driving voltage line PL, and may store a voltage corresponding to a difference between a voltage received from the second thin-film transistor T2 and a first power supply voltage ELVDD supplied to the driving voltage line PL.

The first thin-film transistor T1, which is a driving thin-film transistor, may be connected to the driving voltage line PL and the storage capacitor Cst, and may control a driving current flowing from the driving voltage line PL to the organic light-emitting diode OLED, in accordance with a voltage value stored in the storage capacitor Cst. The organic light-emitting diode OLED may emit light having a certain brightness by the driving current. An opposite electrode (for example, a cathode) of the organic light-emitting diode OLED may receive a second power supply voltage ELVSS.

Although a case where the pixel circuit PC includes two thin-film transistors and one storage capacitor is illustrated in FIG. 6, the disclosure is not limited thereto. The number of thin-film transistors and the number of storage capacitors may vary according to a design of the pixel circuit PC. For example, the pixel circuit PC may further include four or more thin-film transistors in addition to the aforementioned two thin-film transistors.

Referring back to FIG. 5A, the middle area MA may surround the opening area OA according to a planar view. The middle area MA is an area in which a display element such as an organic light-emitting diode is not arranged. Signal lines configured to provide signals to pixels P arranged around the first area OA may traverse the middle area MA. In the peripheral area PA, a scan driver 1100 that provides a scan signal to each of the pixels P, a data driver 1200 that provides a data signal to each of the pixels P, and main power wires (not shown) for providing first and second power supply voltages may be arranged. In FIG. 5A, the data driver 1200 is located on one side of the substrate 100. However, according to some example embodiments, the data driver 1200 may be located on a flexible printed circuit board (FPCB) electrically connected to a pad arranged on one side of the display panel 10. In addition, in FIG. 5A, the first area OA is arranged on the upper left side of the display area DA. However, as shown in FIG. 5B, the first area OA may be arranged at the center of the upper end of the display area DA.

Figure 7A:
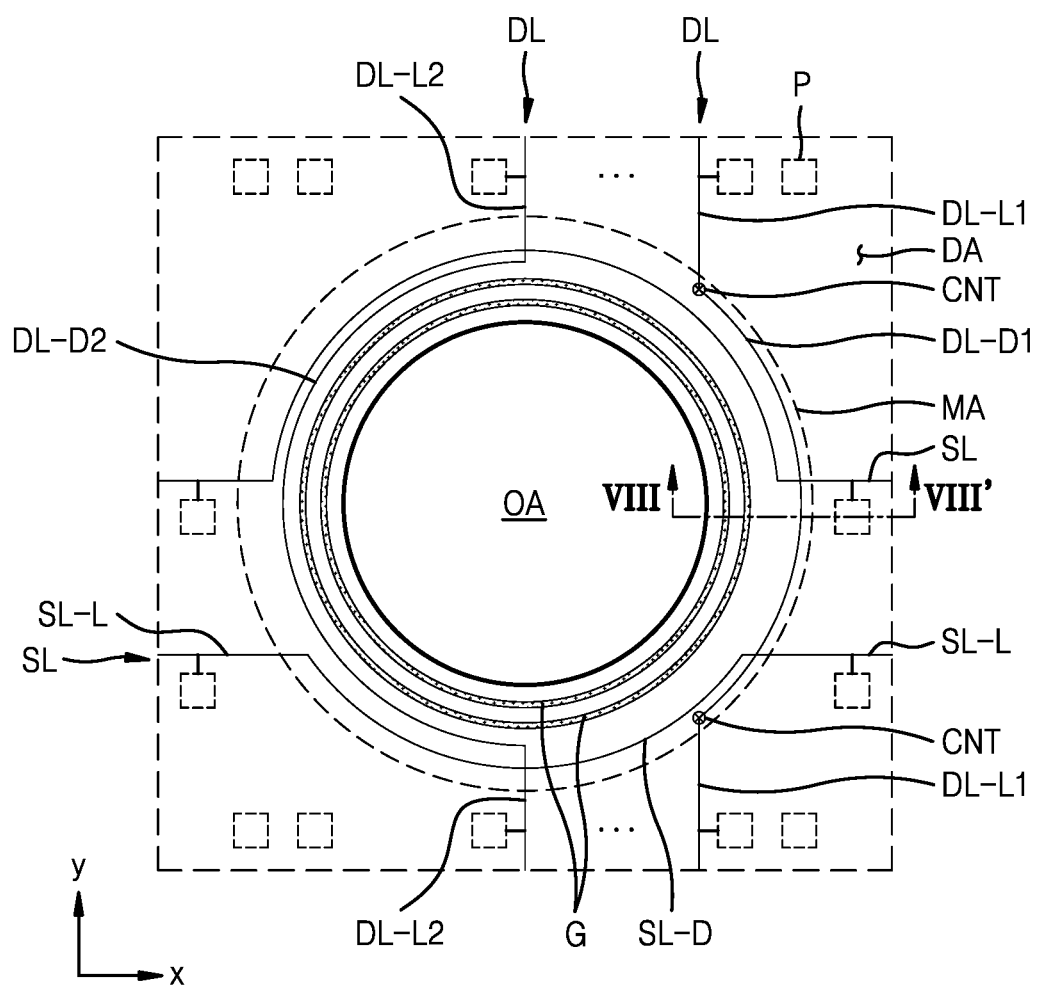
FIGS. 7A and 7B are plan views of a transmission area of a display panel according to some example embodiments.
Figure 7B:
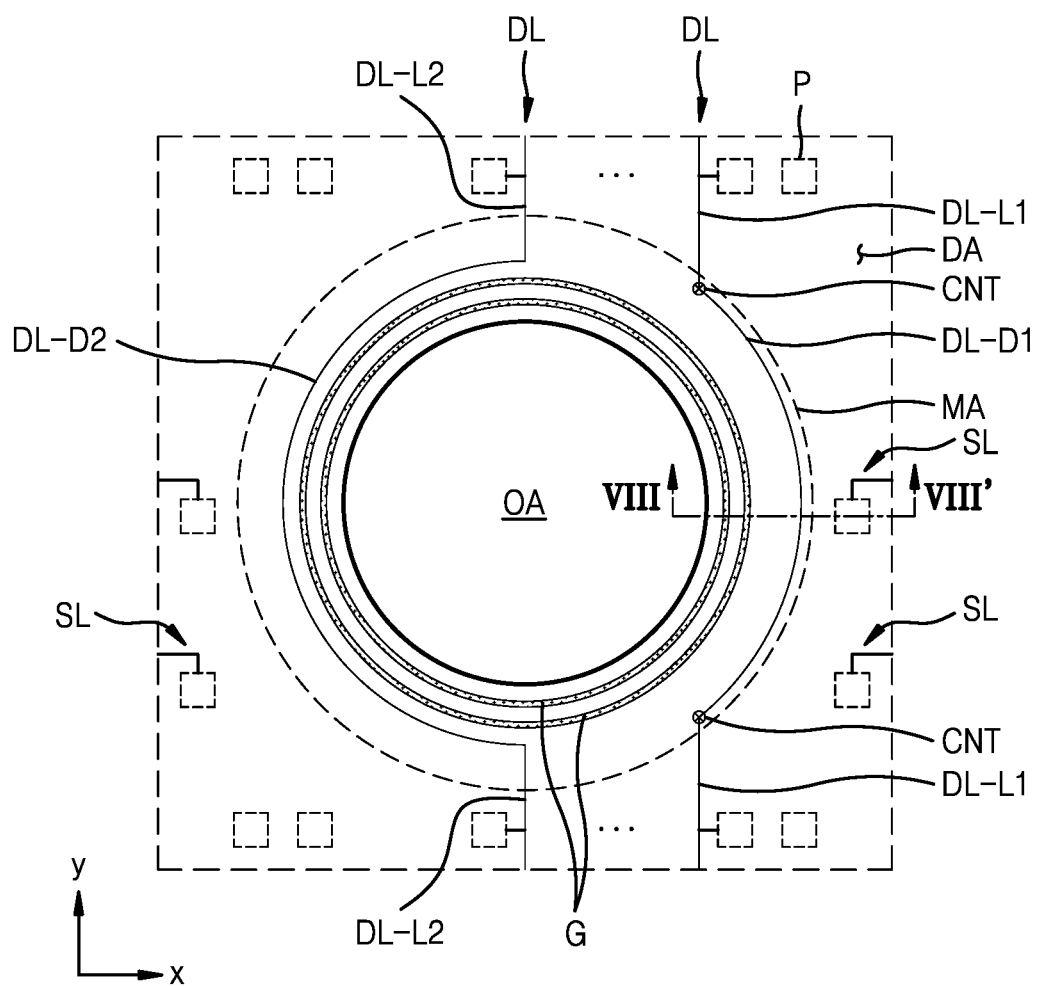

FIGS. 7A and 7B are plan views of a portion of a display panel according to an embodiment.

Referring to FIG. 7A, pixels P may be arranged around the first area OA in the display area DA. Some pixels P may be spaced apart from each other around the first area OA, and the first area OA may be defined between the pixels P. For example, in the plan views of FIGS. 7A and 7B, the pixels P may be arranged up and down around the first area OA, and also arranged left and right around the first area OA.

Signal lines adjacent to the first area OA from among that signal lines that provide signals to the pixels P may detour the first area OA. In the plan view of FIG. 7A, at least one of the data lines DL that traverse the display area DA may extend in a y-direction so as to provide a data signal to the pixels P arranged up and down with the first area OA therebetween, and detour an edge of the first area OA in the middle area MA. In the plan view of FIG. 7A, at least one of the scan lines SL that traverse the display area DA may extend in an x-direction so as to provide a scan signal to the pixels P arranged left and right with the first area OA therebetween, and detour an edge of the first area OA in the middle area MA.

A detouring portion (a circuitous portion or a bypass portion) SL-D of the scan line SL may be located on the same layer as a layer on which an extension portion SL-L traversing the display area DA is arranged, and may be integrally formed with the extension portion SL-L. A detouring portion DL-D1 of at least one of the data lines DL may be arranged on a different layer from a layer on which an extension portion DL-L1 traversing the display area DA is arranged. The detouring portion DL-D1 of the data line DL may be connected to the extension portion DL-L1 through a contact hole. A detouring portion DL-D2 of at least one of the data lines DL may be located on the same layer as a layer on which an extension portion DL-L2 is arranged, and may be integrally formed with the extension portion DL-L2.

One or more grooves G may be arranged between the first area OA and a region of the middle area MA that the scan lines SL and the data lines DL detour. In a plan view, each of the grooves G may have a ring shape surrounding the first area OA. The grooves G may be spaced apart from each other.

As shown in FIG. 7B, left and right portions of the scan line SL with the first area OA therebetween may be cut off without a bypass portion. In other words, with the above-described scan driver 1100 arranged on each of the left and right sides of the display area DA, pixels on the left side of the display area DA may be connected to the scan driver 1100 on the left side and pixels on the right side of the display area DA may be connected to the scan driver 1100 on the right side. In this case, scan lines SL do not need to be continuous while bypassing the first area OA.

Figure 8A:
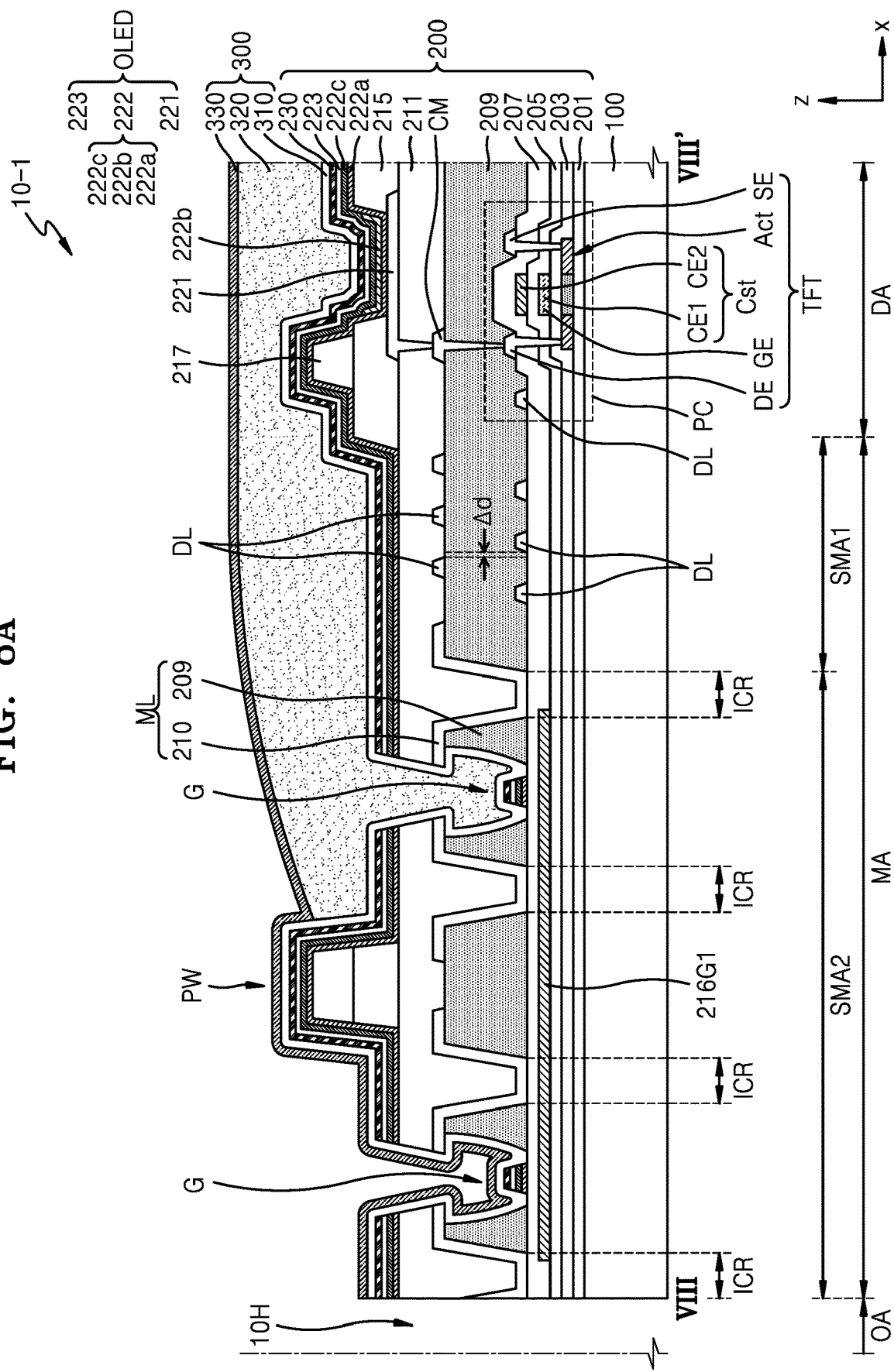
FIG. 8A is a cross-sectional view taken along the line VIII-VIII' of FIG. 7.

FIG. 8A is a cross-sectional view of a display panel 10-1 according to some example embodiments and may correspond to a cross-section taken along the line VIII-VIII' of FIGS. 7A and 7B. FIGS. 9A through 9D are cross-sectional views of a process of manufacturing the display panel 10-1 of FIG. 8A and show the middle area MA.

Referring to the display area DA of FIG. 8A, the substrate 100 may include a glass material or a polymer resin. According to some example embodiments, as shown in the enlarged view of FIG. 3A, the substrate 100 may include a plurality of sub-layers A buffer layer 201 to prevent infiltration of impurities into a semiconductor layer Act of a thin-film transistor TFT may be arranged on the substrate 100. The buffer layer 201 may include an inorganic insulating material, such as silicon nitride, silicon oxynitride, or silicon oxide, and may be a single layer or multiple layers including the inorganic insulating material.

The pixel circuit PC may be arranged on the buffer layer 201. The pixel circuit PC includes the thin-film transistor TFT and the storage capacitor Cst. The thin-film transistor TFT may include the semiconductor layer Act, a gate electrode GE, a source electrode SE, and a drain electrode DE. The thin-film transistor TFT of FIG. 8A may correspond to the driving thin-film transistor described above with reference to FIG. 6. Although not shown in FIG. 8A, a data line DL of the pixel circuit PC is may be electrically connected to a switching thin-film transistor included in the pixel circuit PC. According to the present embodiment, the thin-film transistor TFT is a top gate type in which the gate electrode GE is arranged on the semiconductor layer Act with a gate insulating layer 203 therebetween. However, according to some example embodiments, the thin-film transistor TFT may be a bottom gate type.

The semiconductor layer Act may include polysilicon. Alternatively, the semiconductor layer Act may include, for example, amorphous silicon, an oxide semiconductor, or an organic semiconductor. The gate electrode GE may include a low resistance metal material. The gate electrode GE may include a conductive material including molybdenum (Mo), aluminum (Al), copper (Cu), and titanium (Ti), and may be formed as a multi-layer or single layer including the aforementioned materials.

The gate insulating layer 203 between the semiconductor layer Act and the gate electrode GE may include an inorganic insulating material, such as silicon oxide, silicon nitride, silicon oxynitride, aluminum oxide, titanium oxide, tantalum oxide, or hafnium oxide. The gate insulating layer 203 may be a single layer or multi-layer including the aforementioned materials.

The source electrode SE and the drain electrode DE may be located on the same layer as a layer on which the data line DL is arranged, and may include the same material as that of the data line DL. The source electrode SE, the drain electrode DE, and the data line DL may include a highly conductive material. Each of the source electrode SE and the drain electrode DE may include a conductive material including molybdenum (Mo), aluminum (Al), copper (Cu), and titanium (Ti), and may be a multi-layer or single layer including the aforementioned materials. According to some example embodiments, each of the source electrode SE, the drain electrode DE, and the data line DL may be formed as a multi-layer of Ti/Al/Ti.

The storage capacitor Cst may include a lower electrode CE1 and an upper electrode CE2 overlapping each other with a first interlayer insulating layer 205 therebetween. The storage capacitor Cst may be overlapped with the thin-film transistor TFT. With regard to this, FIG. 8A illustrates a case where the gate electrode GE of the thin-film transistor TFT is the lower electrode CE1 of the storage capacitor Cst. According to some example embodiments, the storage capacitor Cst may not be overlapped with the thin-film transistor TFT. The storage capacitor Cst may be covered by a second interlayer insulating layer 207. The upper electrode CE2 of the storage capacitor Cst may include a conductive material including molybdenum (Mo), aluminum (Al), copper (Cu), and titanium (Ti), and may be formed as a multi-layer or single layer including the aforementioned materials.

The first interlayer insulating layer 205 and the second interlayer insulating layer 207 may include an inorganic insulating material, such as silicon oxide, silicon nitride, silicon oxynitride, aluminum oxide, titanium oxide, tantalum oxide, or hafnium oxide. Each of the first interlayer insulating layer 205 and the second interlayer insulating layer 207 may be a single layer or multi-layer including the aforementioned materials.

The pixel circuit PC including the thin-film transistor TFT and the storage capacitor Cst may be covered with a first organic insulating layer 209. An upper surface of the first organic insulating layer 209 may include an approximately flat surface.

The pixel circuit PC may be electrically connected to a pixel electrode 221. For example, as shown in FIG. 8, a contact metal layer CM may be arranged between the thin-film transistor TFT and the pixel electrode 221. The contact metal layer CM may contact the thin-film transistor TFT through a contact hole formed in the first organic insulating layer 209, and the pixel electrode 221 may contact the contact metal layer CM through a contact hole formed in a second organic insulating layer 211. The contact metal layer CM may include a conductive material including molybdenum (Mo), aluminum (Al), copper (Cu), and titanium (Ti), and may be formed as a multi-layer or single layer including the aforementioned materials. According to some example embodiments, the contact metal layer CM may be formed as a multi-layer of Ti/Al/Ti.

The first organic insulating layer 209 and the second organic insulating layer 211 may include an organic insulating material, such as a commercial polymer (such as polymethyl methacrylate (PMMA) or polystyrene (PS)), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, or a blend thereof. According to some example embodiments, the first organic insulating layer 209 and the second organic insulating layer 211 may include polymide.

The pixel electrode 221 may be on the second organic insulating layer 211. The pixel electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some example embodiments, the pixel electrode 221 may include a reflection layer including, for example, silver (Ag), magnesium (Mg), aluminum (Al), platinum (Pt), palladium (Pd), gold (Au), nickel (Ni), neodymium (Nd), iridium (Ir), chromium (Cr), or a compound of these materials. According to some example embodiments, the pixel electrode 221 may further include a film formed of ITO, IZO, ZnO, or $In_2O_3$ above/below the reflection layer.

A pixel defining layer 215 may be on the pixel electrode 221. The pixel defining layer 215 may include an opening via which an upper surface of the pixel electrode 221 is exposed, and may cover an edge of the pixel electrode 221. The pixel defining layer 215 may include an organic insulating material. Alternatively, the pixel defining layer 215 may include an inorganic insulating material, such as silicon nitride ($SiN_x$), silicon oxynitride (SiON), or silicon oxide ($SiO_x$). Alternatively, the pixel defining layer 215 may include an organic insulating material and an inorganic insulating material.

An intermediate layer 222 includes an emission layer 222b. The intermediate layer 222 may include a first functional layer 222a below the emission layer 222b, and/or a second functional layer 222c above the emission layer 222b. The emission layer 222b may include a low molecular or high molecular organic material that emits light of a certain color.

The first functional layer 222a may be a single layer or multiple layers. For example, when the first functional layer 222a includes a high molecular organic material, the first functional layer 222a is a hole transport layer (HTL) having a single-layered structure, and may include poly-(3,4)-ethylene-dihydroxy thiophene (PEDOT) and/or polyaniline (PANI). When the first functional layer 222a includes a low molecular weight material, the first functional layer 222a may include a hole injection layer (HIL) and a hole transport layer (HTL).

The second functional layer 222C is optional. For example, when the first functional layer 222a and the emission layer 222b include high molecular weight materials, the second functional layer 222c may be formed. The second functional layer 222c may be a single layer or multiple layers. The second functional layer 222c may include an electron transport layer (ETL) and/or an electron injection layer (EIL).

The emission layer 222b of the intermediate layer 222 may be arranged in each pixel in the display area DA. The emission layer 222b may be patterned to correspond to the pixel electrode 221. Unlike the emission layer 222b, the first functional layer 222a and/or the second functional layer 222c of the intermediate layer 222 may extend toward the middle area MA such that the first functional layer 222a and/or the second functional layer 222c are located in not only the display area DA but also the middle area MA.

The opposite electrode 223 may include a conductive material having a low work function. For example, the opposite electrode 223 may include a (semi)transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy of these materials. Alternatively, the opposite electrode 223 may further include a layer, such as ITO, IZO, ZnO, or $In_2O_3$, on the (semi)transparent layer including any of the above-described materials. The opposite electrode 223 may be arranged not only in the display area DA but also the middle area MA. The first functional layer 222a, the second functional layer 222c, and the opposite electrode 223 may be formed via thermal deposition.

A capping layer 230 may be located on the opposite electrode 223. For example, the capping layer 230 may include LiF and may be formed via thermal deposition. According to some embodiments, the capping layer 230 may be omitted.

A spacer 217 may be on the pixel defining layer 215. The spacer 217 may include an organic insulating material such as polyimide. Alternatively, the spacer 217 may include an inorganic insulating material or may include an inorganic insulating material and an organic insulating material.

The spacer 217 may include a different material from a material used to form the pixel defining layer 215, or may include the same material as the material used to form the pixel defining layer 215. According to some example embodiments, the pixel-defining layer 215 and the spacer 217 may include polymide. The pixel defining layer 215 and the spacer 217 may be simultaneously (or concurrently) formed during a mask process that uses a half-tone mask.

The organic light-emitting diode OLED is covered with the thin-film encapsulation layer 300. The thin-film encapsulation layer 300 may include at least one inorganic encapsulation layer and at least one organic encapsulation layer. FIG. 9 illustrates that the thin-film encapsulation layer 300 includes a first inorganic encapsulation layer 310, a second inorganic encapsulation layer 330, and an organic encapsulation layer 320 therebetween. According to some example embodiments, the number of organic encapsulation layers, the number of inorganic encapsulation layers, and a stacking sequence may be modified.

The first and second inorganic encapsulation layers 310 and 330 may include at least one inorganic material, such as aluminum oxide, titanium oxide, tantalum oxide, hafnium oxide, zinc oxide, silicon oxide, silicon nitride, and silicon oxynitride. The first interlayer insulating layer 310 and the second interlayer insulating layer 330 may be a single layer or multi-layer including the aforementioned materials. The organic encapsulation layer 320 may include a polymer-based material. Examples of the polymer-based material may include acrylic resin, epoxy-based resin, polyimide, and polyethylene. According to some example embodiments, the organic encapsulation layer 320 may include acrylate.

Thicknesses of the first inorganic encapsulation layer 310 and the second inorganic encapsulation layer 330 may be different from each other. The thickness of the first inorganic encapsulation layer 310 may be greater than the thickness of the second inorganic encapsulation layer 330. Alternatively, the thickness of the second inorganic encapsulation layer 330 may be greater than the thickness of the first inorganic encapsulation layer 310, or the thicknesses of the first inorganic encapsulation layer 310 and the second inorganic encapsulation layer 330 may be the same.

Referring to the middle area MA of FIG. 8A, the middle area MA may include a first sub-middle area SMA1 that is relatively away from the first area OA, and a second sub-middle area SMA2 that is relatively close to the first area OA. Lines that detour the first area OA, and the grooves G may be arranged in the middle area MA.

Lines, for example, the data lines DL, may be located in the first sub-middle area SMA1 as shown in FIG. 8A. The data lines DL in the first sub-middle area SMA1 shown in FIG. 8A correspond to the detouring portions DL-D1 and DL-D2 of the data lines DL described above with reference to FIGS. 7A and 7B. The first sub-middle area SMA1 may be understood as a line region or a detour region that lines, such as the data lines DL, detour.

Data lines DL may alternate with each other, with an insulating layer therebetween. For example, like one of neighboring data lines DL being arranged under an insulating layer (e.g. the first organic insulating layer 209 or the first interlayer insulating layer 205) and another of the neighboring data lines DL being arranged on an insulating layer (e.g. the first organic insulating layer 209 or the first interlayer insulating layer 205), the data lines DL may be alternately arranged. When the data lines DL are alternately arranged with an insulating layer therebetween, a distance Δd (a pitch) between the data lines may be reduced. Although FIG. 8A shows the data lines DL located in the first sub-middle area SMA1, the scan lines SL described above with reference to FIGS. 7A and 7B, for example, the detouring portions of the scan lines SL, may be also located in the first sub-middle area SMA1.

One or more grooves G may be arranged in the second sub-middle area SMA2. The organic material layer included in the intermediate layer 222, for example, the first functional layer 222a and/or the second functional layer 222c, may be disconnected (or broken up) by the groove G. The second sub-middle area SMA2 may be understood as a disconnection region (or a breaking-up region) of the organic material layer, or a groove region.

The groove G may be formed in a multi-layered film ML arranged between the substrate 100 and the pixel electrode 221. The multi-layered film ML may include a first sub-layer including an organic layer, and a second sub-layer including an inorganic layer. With regard to this, FIG. 8A shows a multi-layered film ML including the first organic insulating layer 209 and an inorganic layer 210. The inorganic layer 210 may be located on the same layer as a layer (i.e., the first organic insulating layer) on which the contact metal layer CM is arranged, and be formed during the same mask process as a mask process of forming the contact metal layer CM.

The inorganic layer 210 may include the same material as that of the contact metal layer CM. For example, the inorganic layer 210 may include a metal as a material including no carbon, and may include three sub-layers, like Ti/Al/Ti.

Figure 9A:
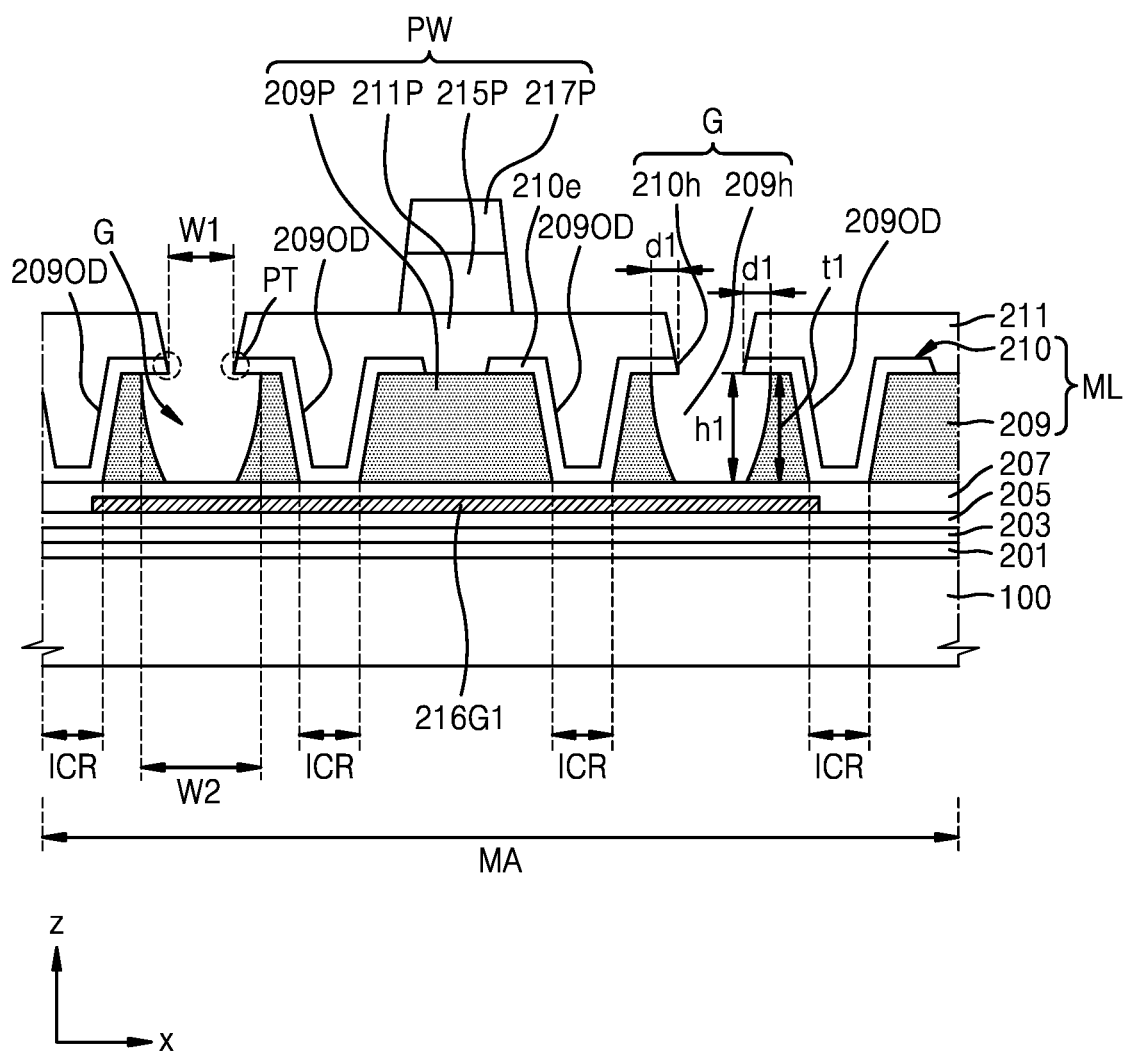
FIGS. 9A through 9D are cross-sectional views for describing a method of manufacturing the display panel of FIG. 8A.

Referring to FIGS. 8A and 9A, the groove G of the multi-layered film ML may be formed before a process of forming the intermediate layer 222. The groove G may have an undercut structure. The groove G may include a first hole 210h formed in the inorganic layer 210 and a groove or second hole 209h formed in the first organic insulating layer 209. FIG. 9A shows that the first hole 210h and the second hole 209h overlapping with each other constitute the groove G. A bottom surface of the groove G may be located on a virtual surface between a top surface of the substrate 100 and a top surface of the first organic insulating layer 209. With regard to this, it is shown in FIG. 9A that the bottom surface of the groove G is located on a virtual surface that is the same as a top surface of the second interlayer insulating layer 207.

Ends of the inorganic layer 210 that define the first hole 210h may be a so-called undercut structure that protrudes further toward a center of the groove G than an inner lateral surface of the first organic insulating layer 209 arranged below the inorganic layer 210. For example, a first width W1 of the first hole 210h may have a value less than that of a second width W2 of the second hole 209h. Here, the second width W2 of the second hole 209h may be a width of a portion of the first organic insulating layer 209 right under the ends of the inorganic layer 210 that define the first hole 210h. The ends of the inorganic layer 210 that protrude toward the center of the groove G and/or the first hole 210h may constitute a pair of eaves (or a pair of protruding tips, or tips PT). A protruding length d1 of each tip PT may be less than a depth h1 of the second hole 209h described below. For example, the protruding length d1 of each tip PT may be about 2 μm or less. According to some example embodiments, the protruding length d1 may be about 1 μm to about 1.5 μm.

As described above, a first end of the inorganic layer 210 that constitutes the tip PT may be exposed but the other end, for example, a second end 210e located opposite to the tip PT, may be covered by the second organic insulating layer 211, as shown in FIG. 9A.

The depth h1 of the second hole 209h may be the same as a thickness t1 of the first organic insulating layer 209. The depth h1 of the second hole 209h may correspond to a depth of the groove G. According to some example embodiments, the depth of the groove G may be about 1.5 μm or more. For example, the depth of the groove G may be about 2 μm or more.

The first organic insulating layer 209 may include an opening 209OD. The opening 209OD may be adjacent to the groove G and be spaced apart from the groove G by a predetermined interval. According to some example embodiments, as shown in FIG. 9A, the openings 209OD may be arranged on two opposite sides of the groove G. For example, around the groove G, one opening 209OD may be arranged on a side of the display area DA, and the other opening 209OD may be arranged on a side of the first area OA.

The inorganic layer 210 may directly contact the second interlayer insulating layer 207, which is an inorganic insulating layer, under the first organic insulating layer 209 through the opening 209OD, thereby forming an inorganic contract region ICR.

The inorganic layer 210 may directly contact a top surface of the second interlayer insulating layer 207 through the opening 209OD formed in the first organic insulating layer 209, and the inorganic layer 210 and the second interlayer insulating layer 207 contacting each other may form the inorganic contract region ICR, as described above.

The inorganic contract region ICR prevents infiltration of moisture. In other words, a layer including an organic material among layers over the substrate 100 may serve as a path through which moisture progresses. According to some example embodiments, as shown in FIG. 8A, when the display panel 10-1 includes the first opening 10H corresponding to the first area OA, moisture may progress in a direction (an x-direction, referred to as a lateral direction hereinafter) parallel to the top surface of the substrate 100 through the first opening 10H. However, according to some example embodiments, because the middle area MA includes the inorganic contact region ICR, progression of moisture to the display area DA through the first organic insulating layer 209 may be blocked.

A partition wall PW may be arranged between the grooves G. The partition wall PW may include a plurality of sub-organic insulating layers that are sequentially stacked. According to some example embodiments, as shown in FIG. 9A, the partition wall PW may have a structure in which a portion 209P of the first organic insulating layer 209, a portion 211P of the second organic insulating layer 211, a portion 215P of the pixel-defining layer 215, and a portion 217P of the spacer 217 are stacked. According to some example embodiments, at least one of the portion 209P of the first organic insulating layer 209, the portion 211P of the second organic insulating layer 211, the portion 215P of the pixel-defining layer 215, or the portion 217P of the spacer 217 may be omitted. In this case, a height from the substrate 100 to a top surface of the partition wall PW may be less than a height from the substrate 100 to a top surface of the spacer 217.

Figure 9B:
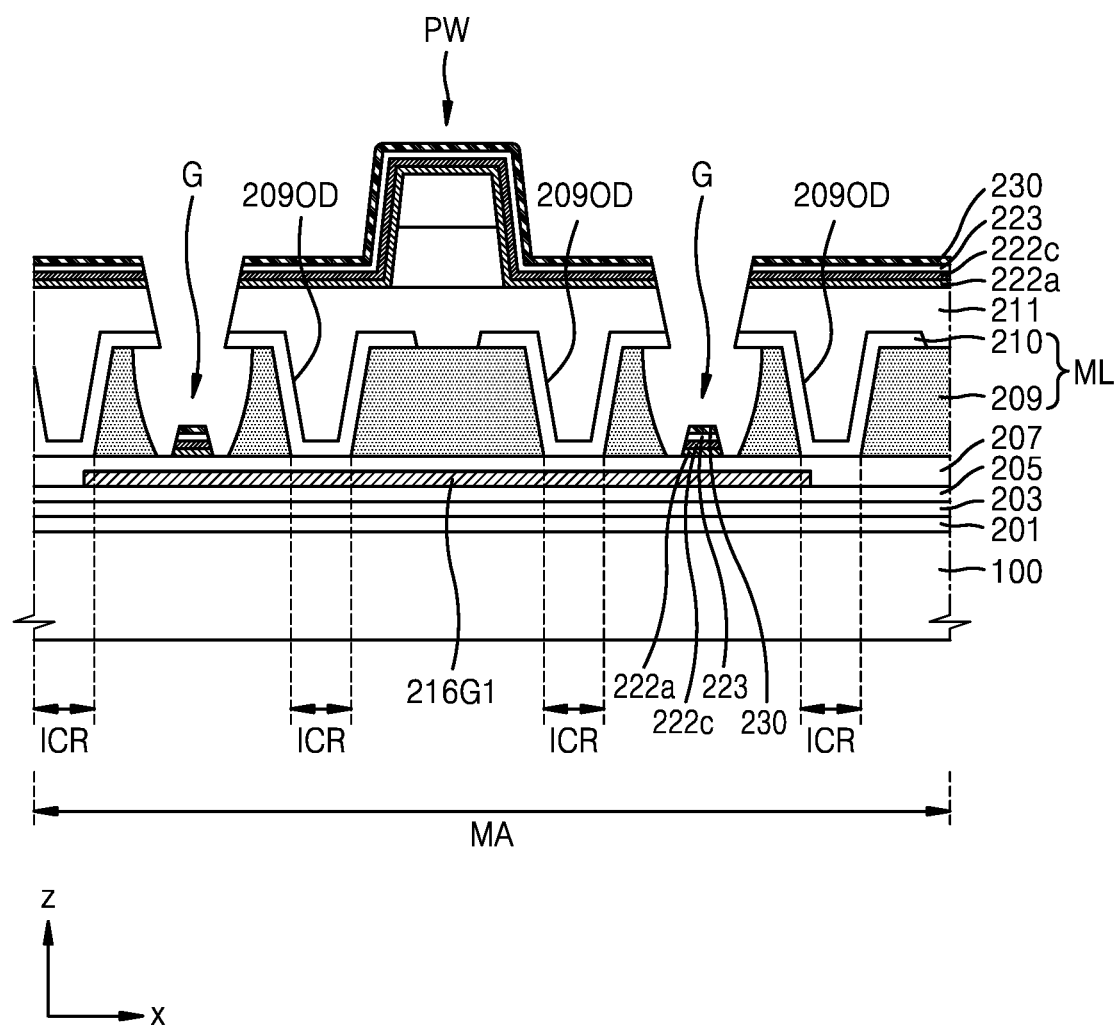

Referring to FIGS. 8A and 9B, the intermediate layer 222 may be formed after the groove G is formed. Each of the first functional layer 222a and/or the second functional layer 222c of the intermediate layer 222 may be integrally formed by using an open mask or the like such that each of the first functional layer 222a and/or the second functional layer 222c is located in the display area DA and the middle area MA. In this case, the first functional layer 222a and/or the second functional layer 222c may be disconnected or broken up by the groove G.

A layer including an organic material among layers over the substrate 100 may serve as a path through which moisture progresses. Because the first functional layer 222a and/or the second functional layer 222c include an organic material, the first functional layer 222a and/or the second functional layer 222c may serve as a moisture transmission path. However, because the first functional layer 222a and/or the second functional layer 222c are disconnected or broken up by the groove G, progression of moisture through the first functional layer 222a and/or the second functional layer 222c to the organic light-emitting diode OLED may be prevented.

Figure 9C:
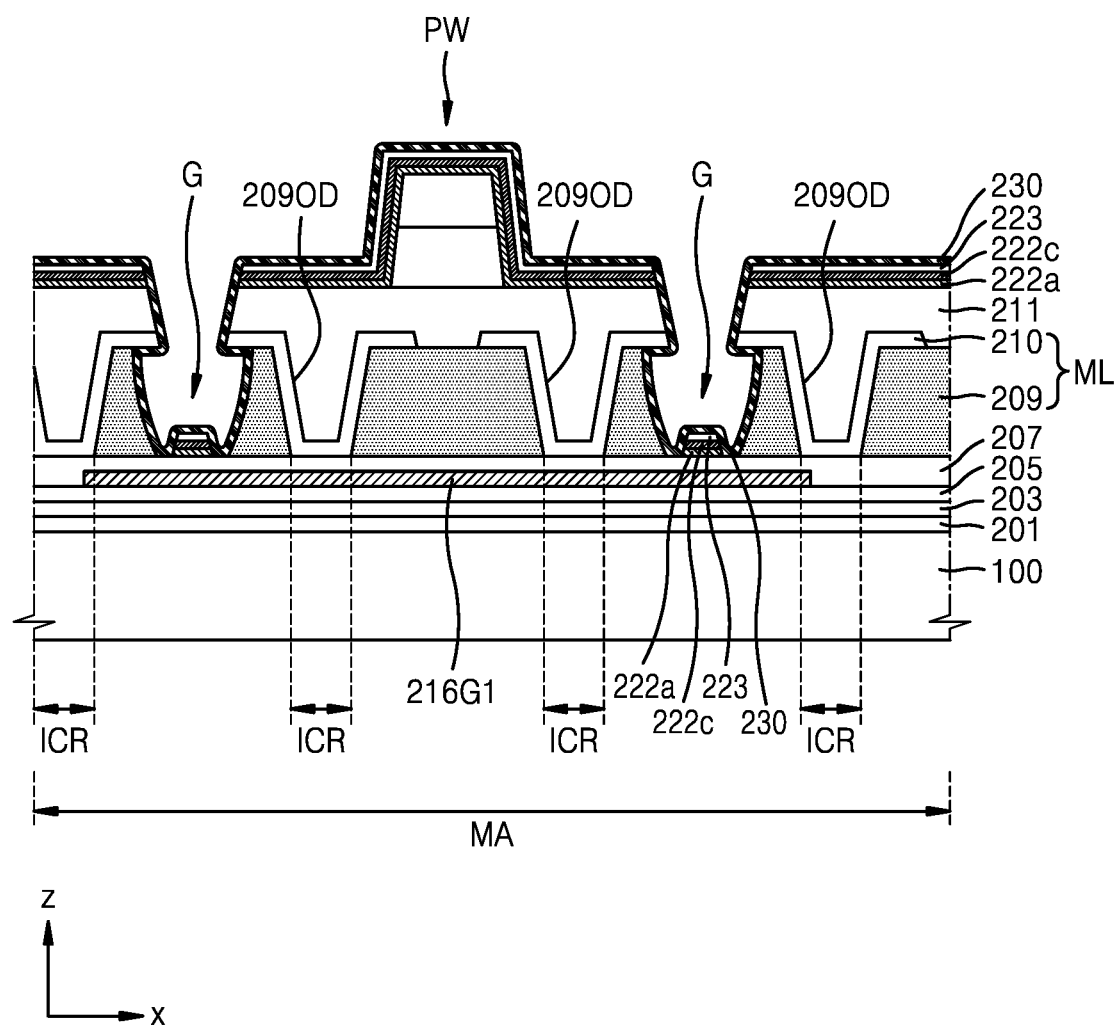

Like the first functional layer 222a and/or the second functional layer 222c, the opposite electrode 223 formed via thermal deposition may be disconnected by the groove G. The capping layer 230 including LiF, for example, may be also disconnected by the groove G. According to some example embodiments, when the capping layer 230 includes an inorganic material such as silicon nitride, silicon oxynitride, and/or silicon oxide, the capping layer 230 may be continuously formed without disconnection by the groove G as shown in FIG. 9C. According to some example embodiments, the capping layer 230 may be omitted.

Figure 9D:
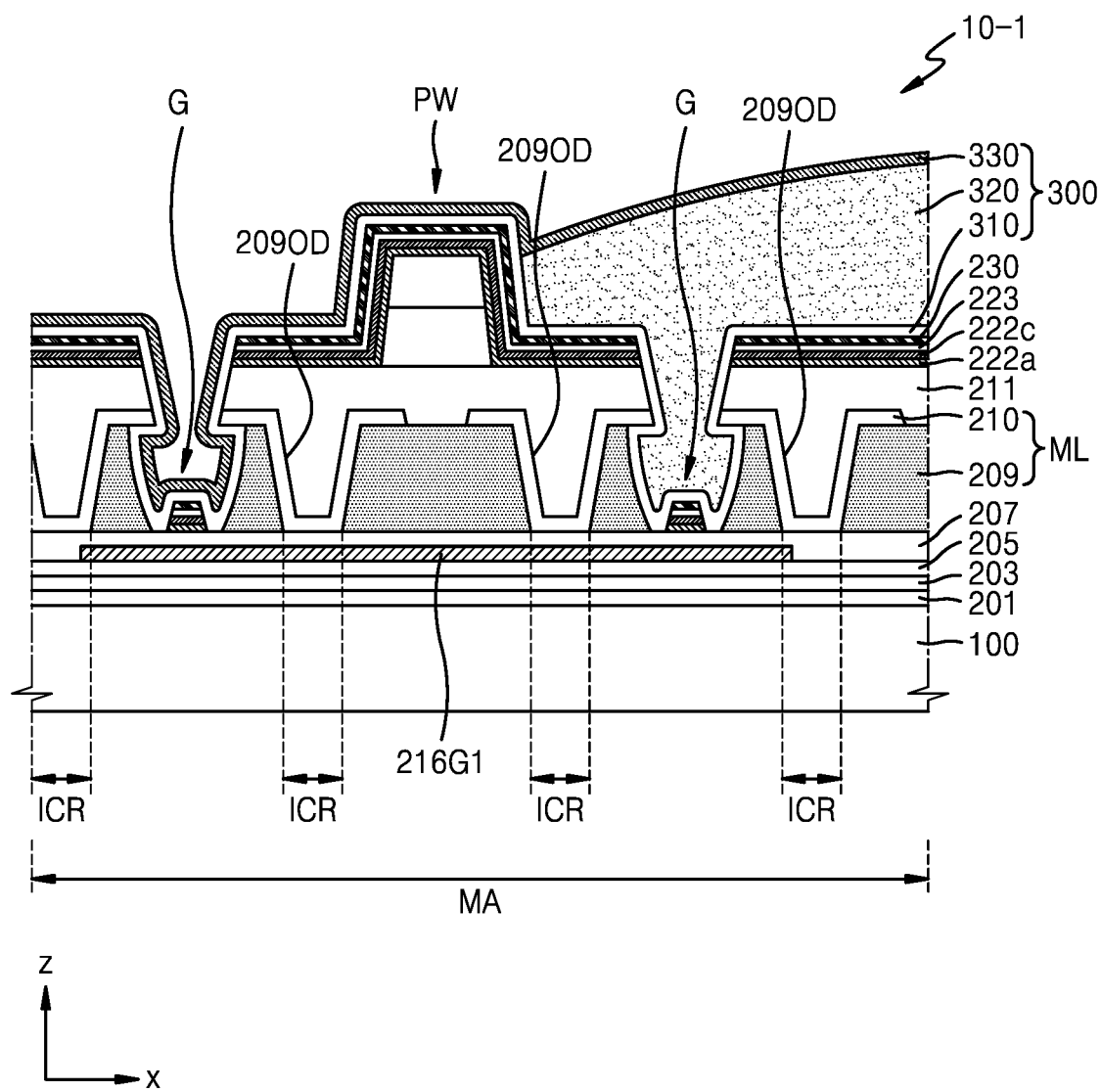

Referring to FIGS. 8A and 9D, the thin-film encapsulation layer 300 may be formed. The thin-film encapsulation layer 300 may prevent the organic light-emitting diode OLED from being damaged or deteriorated by external impurities by covering the organic light-emitting diode OLED of the display area DA.

The thin-film encapsulation layer 300 may include at least one organic encapsulation layer and at least one inorganic encapsulation layer. The first inorganic encapsulation layer 310 formed via chemical vapor deposition (CVD) or the like may have relatively excellent step coverage compared to the first functional layer 222a, the second functional layer 222c, and/or the opposite electrode 223. As shown in FIG. 9D, the first inorganic encapsulation layer 310 may be continuously formed. For example, the first inorganic encapsulation layer 310 may cover an entire inner surface of the groove G.

The organic encapsulation layer 320 may be formed by coating a monomer on the substrate 100 and hardening the monomer. Alternatively, the organic encapsulation layer 320 may be formed by coating a polymer. An end of the organic encapsulation layer 320 that faces the first area OA may be adjacent to one side of the partition wall PW.

The second inorganic encapsulation layer 330 may be located on the organic encapsulation layer 320. The second inorganic encapsulation layer 330 may directly contact the first inorganic encapsulation layer 310 in a partial region of the middle area MA. For example, as shown in FIGS. 8A and 9D, the first inorganic encapsulation layer 310 and the second inorganic encapsulation layer 330 may contact each other in a partial region of the middle area MA that is adjacent to the first area OA.

Although it is shown in FIGS. 8A through 9D that the display panel 10-1 includes the first opening 10H corresponding to the first area OA, the display panel 10-1 may not include the first opening 10H corresponding to the first area OA as described with reference to FIGS. 3B through 3D.

The above-described characteristics are equally applicable to display panel(s) to be described later with reference to FIGS. 10A through 17B.

A cross-section of the display panel 10-1 shown in FIG. 8A may be understood as a structure surrounding the first area OA. For example, each of the grooves G of FIG. 8A may have a ring shape surrounding the first area OA when viewed in a direction perpendicular to the top surface of the substrate 100 as shown in FIGS. 7A and 7B. Similarly, the partition wall PW may also have a ring shape surrounding the first area OA when viewed in a direction perpendicular to the top surface of the substrate 100. Similarly, an element shown in FIG. 8A, for example, elements (e.g. the inorganic layer 210, etc.) included in the middle area MA, may have a ring shape surrounding the first area OA when viewed in a direction perpendicular to the top surface of the substrate 100. The above-described characteristics are equally applicable to display panel(s) to be described later with reference to FIGS. 10A through 17B.

Referring back to FIG. 8A, a metal layer 216G1 is arranged under the grooves G in the middle area MA. The metal layer 216G1 covers the space where the inorganic layer 210 forming the inorganic contact region ICR is empty. In other words, the inorganic layer 210 is a metal layer such as the contact metal layer as described above, but there are no metal layers, such as the inorganic layer 210, under the grooves G. In addition, because the opposite electrode 223, which is another metal layer, is broken up by the grooves G, the metal layer is empty at the locations overlapped by the grooves G, and the metal layer 216G1 covers the locations where the metal layer is empty. The metal layer 216G1 covers the vicinity of the grooves as described above in order to prevent the inside of the display panel 10-1 from being seen from the outside.

In other words, because the optical functional layer 50 preventing reflection by using polarization is stacked on the display panel 10, when external light enters and is then reflected to the outside, the external light is blocked by the optical functional layer 50, so that the inside of the display panel 10 is not visually recognized by the eyes of a user. However, this is possible when reflection occurs due to a regular phase difference by a metal layer. When external light is reflected by a non-metal layer such as polyimide, polarization does not properly function due to an irregular phase difference, and thus the inside of the display panel 10 may be visually recognized by the eyes of a user. To prevent this problem, a method of providing black matrices in regions of the window 60 corresponding to the grooves G to cover reflected light may be considered. However, use of this method requires a space for arranging special black matrices, consequently leading to an increase in a dead space. However, when a portion overlapped by the grooves G, namely, a portion where a metal layer is empty, is covered by the metal layer 216G1 under the grooves G as in the present embodiment, visual recognition of reflected light may be sufficiently prevented using a reflection preventing function of the optical functional layer 50 without needing to providing special black matrices. Thus, the middle area MA surrounding the first area OA, which is a transmission area, may be prevented from being visually recognized by a user.

According to the present embodiment, the metal layer 216G1 may include the same material as that included in the upper electrode CE2 of the storage capacitor Cst and may be formed on the same layer as the layer on which the upper electrode CE2 of the storage capacitor Cst is formed. However, the location of the metal layer 216G1 is not limited thereto. As long as the metal layer 216G1 covers locations where a metal layer is empty, including the grooves G, according to a plan view, the metal layer 216G1 may be formed on any other layer.

Figure 8B:
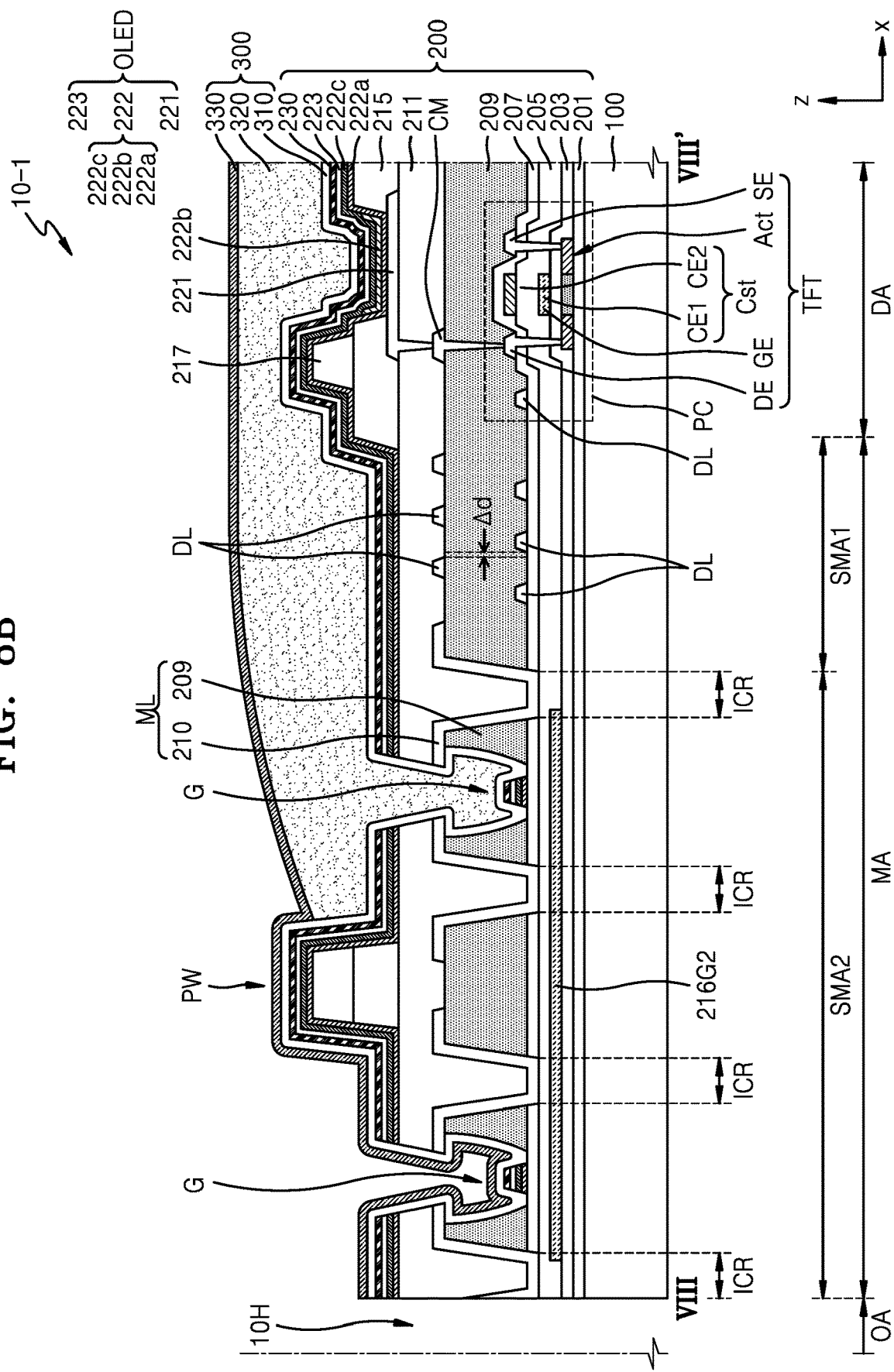
FIG. 8B is a cross-sectional view of a modifiable example of FIG. 8A.

For example, as shown in FIG. 8B, a metal layer 216G2 may also be formed, including the same material as that included in the gate electrode GE of the thin-film transistor TFT, namely, the lower electrode CE1 of the storage capacitor Cst, and being on the same layer as the layer on which the gate electrode GE of the thin-film transistor TFT, namely, the lower electrode CE1 of the storage capacitor Cst, is formed. Also in this case, the metal layer 216G2 may effectively prevent a portion of the middle area MA not covered by the inorganic layer 210, including the grooves G, from being visually recognized by a user.

Furthermore, because the metal layers 216G1 and 216G2 are continuously arranged even under the partition wall PW, if no metal layers exist under the partition wall PW, visual recognition of reflected light may be prevented.

Figure 10A:
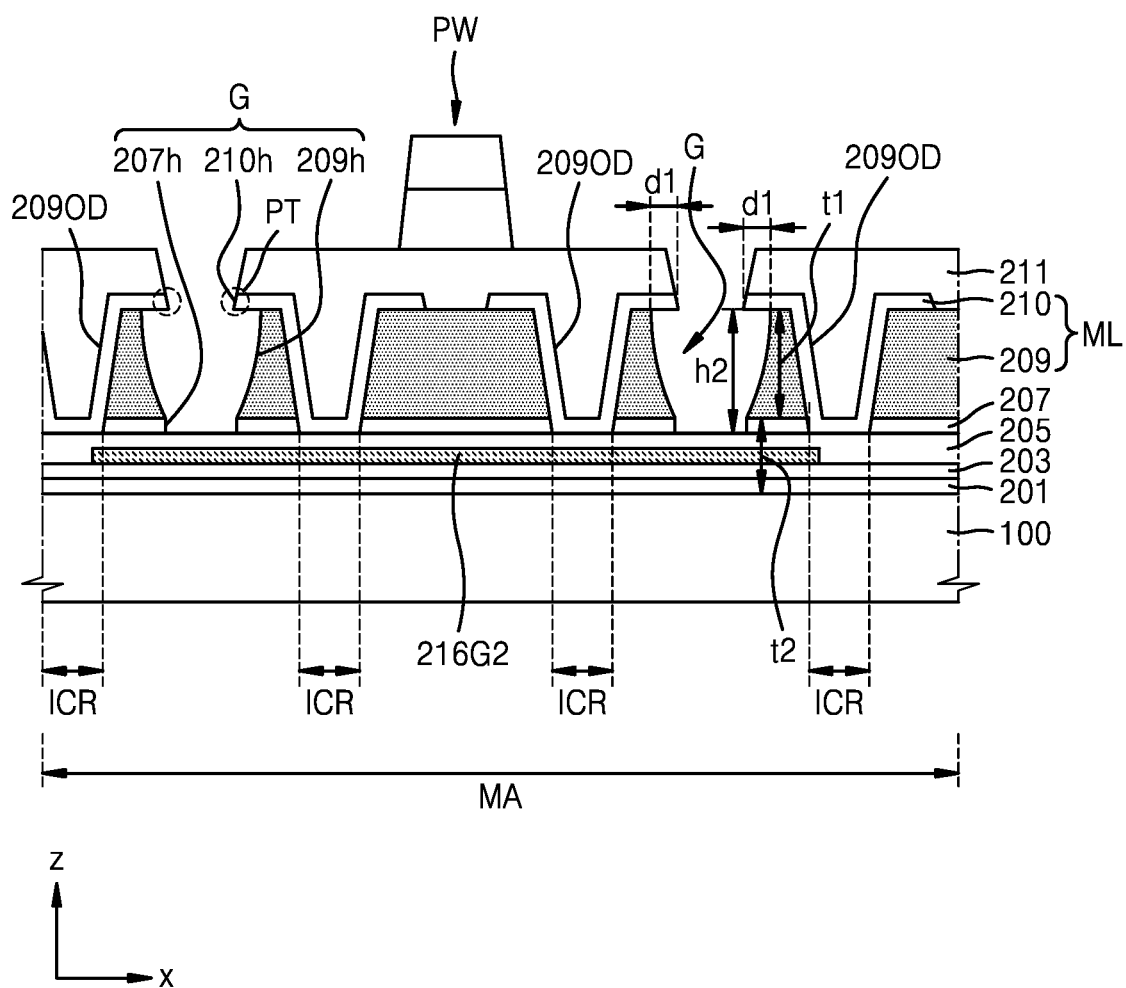
FIGS. 10A and 10B are cross-sectional views of a method of manufacturing a display panel according to some example embodiments.
Figure 10B:
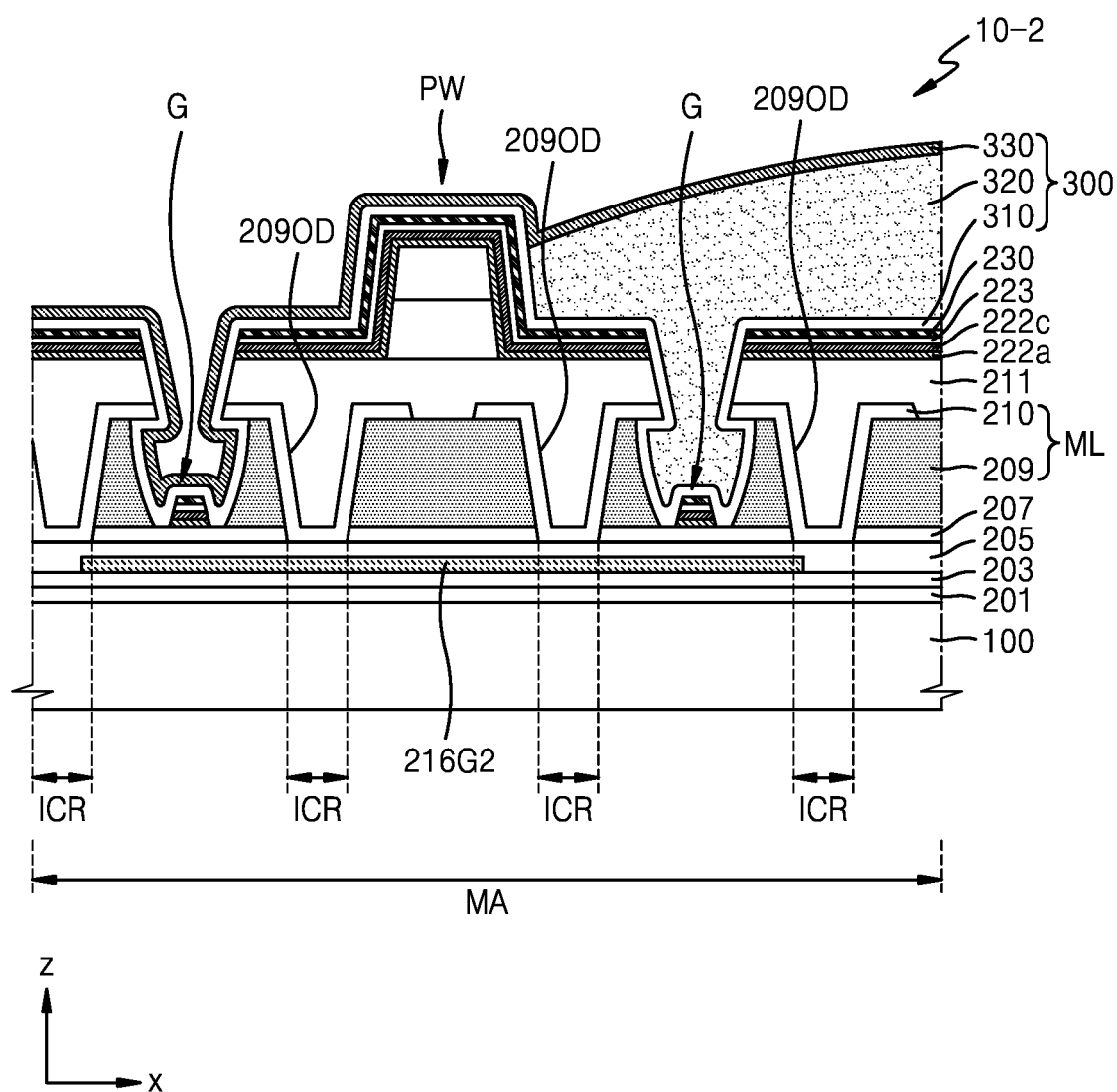

FIGS. 10A and 10B are cross-sectional views of a method of manufacturing a display panel 10-2 according to some example embodiments, and show the middle area MA.

Referring to FIG. 10A, grooves G are formed in a multi-layered film ML, and the multi-layered film ML may include three or more layers. For example, the multi-layered film ML may include a first sub-layer including an organic layer, a second sub-layer located on the first sub-layer and including an inorganic layer, and at least one lower insulating layer (or a third sub-layer) arranged under the organic layer, the at least one lower insulating layer including an inorganic insulating layer. According to some example embodiments, as shown in FIG. 10A, the multi-layered film ML may include the first organic insulating layer 209, the inorganic layer 210 on the first organic insulating layer 209, and the second interlayer insulating layer 207 under the first organic insulating layer 209.

During a process of forming the grooves G, a portion of at least one inorganic insulating layer arranged under the first organic insulating layer 209 may be etched. For example, while a portion of the second interlayer insulating layer 207 is being etched, a third hole 207h may be formed in the second interlayer insulating layer 207. According to some example embodiments, a recess instead of the third hole 207h penetrating through the second interlayer insulating layer 207 may be formed in the second interlayer insulating layer 207 shown in FIG. 10A.

Because each groove G is formed while a portion of at least one inorganic insulating layer arranged under the first organic insulating layer 209 is removed, a depth h2 of the groove G may be greater than the thickness t1 of the first organic insulating layer 209 (h2>t1) and less than a sum of the thickness t1 of the first organic insulating layer 209 and a thickness t2 of the at least one inorganic insulating layer (t1+t2>h2). The bottom surface of the groove G may be located on a virtual surface located between the top surface of the substrate 100 and the top surface of the second interlayer insulating layer 207. The depth h2 of the groove G may be about 1.5 μm or more. For example, the depth h2 of the groove G may be about 2 μm or more, or about 2.5 μm or more, or about 3 μm or more, or about 3.5 μm or more.

The groove G may have an undercut shape, and a tip PT of the inorganic layer 210 may extend toward a center of the groove G and may constitute an eave shape. A protruding length d1 of the tip PT may be equal to or less than about 2.0 μm and, for example, may be about 1 μm to about 1.5 μm.

Next, as shown in FIG. 10B, the intermediate layer 222, the opposite electrode 223, and the capping layer 230 may be sequentially formed over the substrate 100 in which the grooves G are formed. According to some example embodiments, the first functional layer 222a, the second functional layer 222c, the opposite electrode 223, and the capping layer 230 may each be disconnected or broken up in the middle area MA by the grooves G. According to some example embodiments, the capping layer 230 may be omitted or continuously formed without disconnection by the grooves G as described with reference to FIG. 9C.

The partition wall PW may be arranged between the grooves G and the characteristics of other elements of a display panel 10-3, like an end of the organic encapsulation layer 320 being adjacent to one side of the partition wall PW adjacent to the display area DA, are the same as those described above with reference to FIGS. 8A through 9D.

Also in the present embodiment, the metal layer 216G2 includes the same material as that included in the gate electrode GE of the thin-film transistor TFT, namely, the lower electrode CE1 of the storage capacitor Cst, and is formed on the same layer as the layer on which the gate electrode GE of the thin-film transistor TFT, namely, the lower electrode CE1 of the storage capacitor Cst, is formed. Similarly, the metal layer 216G2 may effectively prevent a portion of the middle area MA not covered by the inorganic layer 210, including the grooves G, from being visually recognized by a user.

Figure 11A:
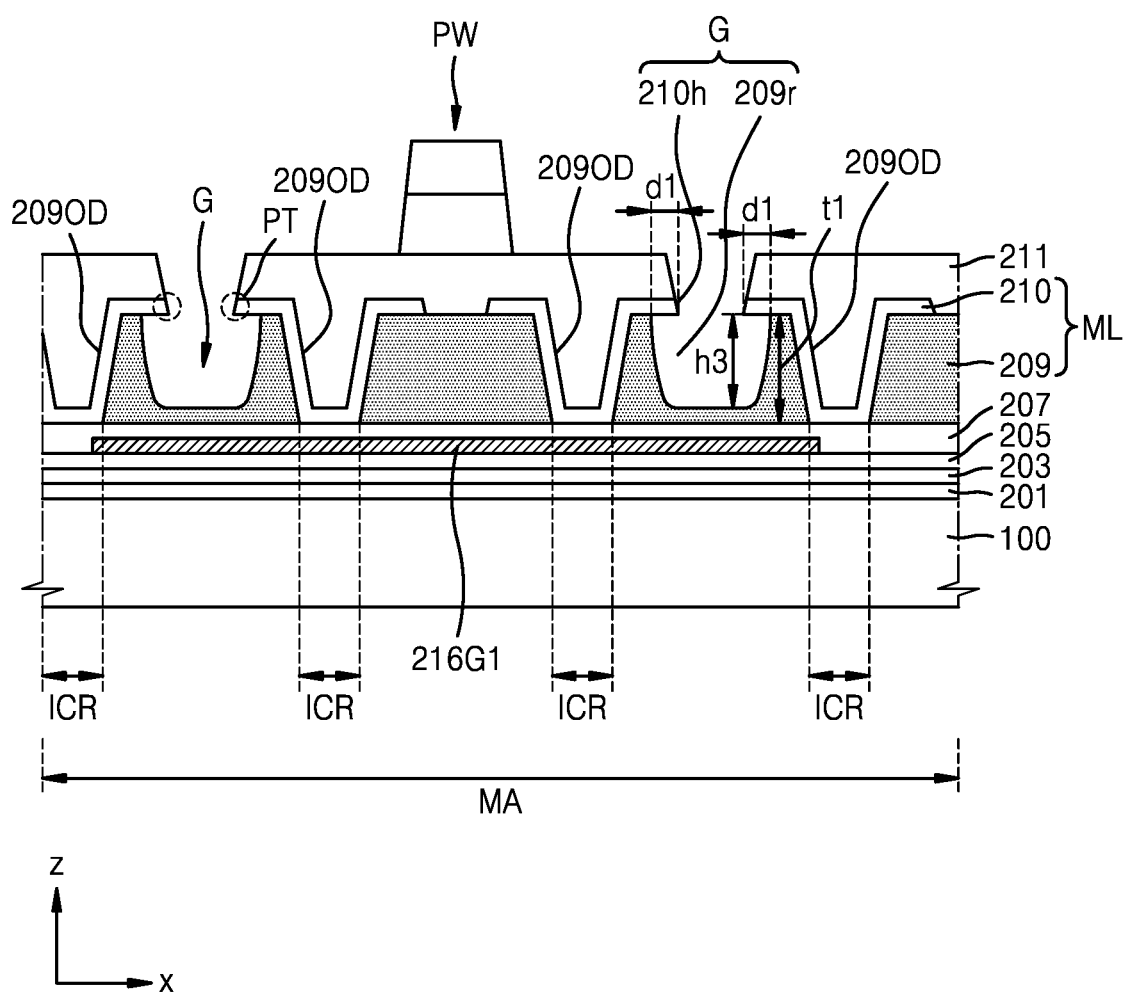
FIGS. 11A and 11B are cross-sectional views of a method of manufacturing a display panel according to some example embodiments.
Figure 11B:
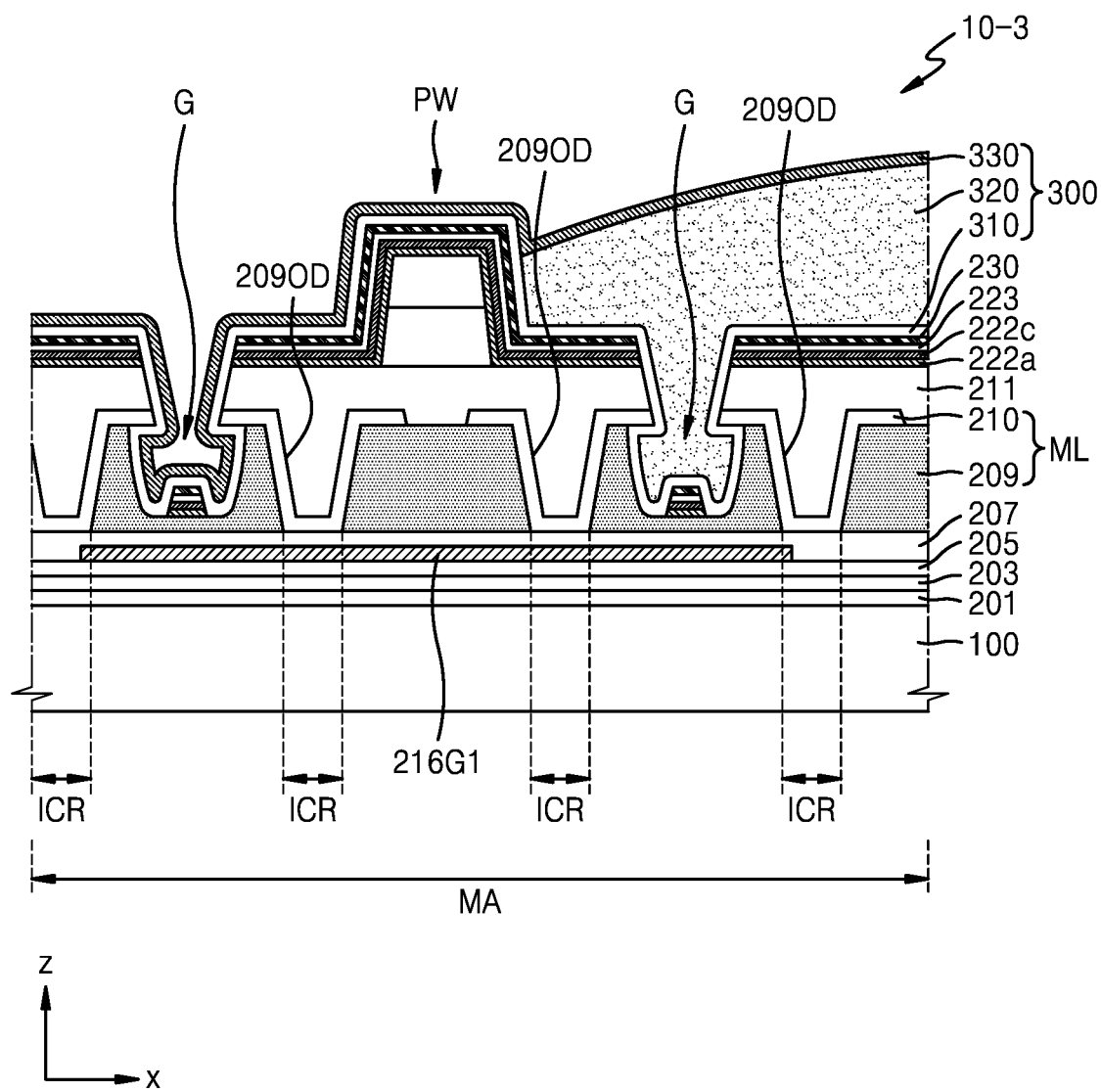

FIGS. 11A and 11B are cross-sectional views of a method of manufacturing a display panel 10-3 according to some example embodiments, and show the middle area MA.

Referring to FIG. 11A, grooves G may be formed in the multi-layered film ML including the first organic insulating layer 209 and the inorganic layer 210. The first hole 210h formed in the inorganic layer 210 and a recess 209r formed in the first organic insulating layer 209 may constitute each groove G. The depth of the groove G, for example, a depth h3 of the recess 209r, may be less than the thickness t1 of the first organic insulating layer 209. The depth h3 of the recess 209r may be about 1.5 μm or more, for example, about 2 μm or more.

As shown in FIG. 11A, when the depth h3 of the recess 209r is less than the thickness t1 of the first organic insulating layer 209, the bottom surface of the groove G may be located on a virtual surface between a top surface and a bottom surface of the first organic insulating layer 209. In this case, a portion of the first organic insulating layer 209 under the bottom surface of the groove G may provide a path through which moisture infiltrates. However, according to some example embodiments, because the openings 209OD are respectively arranged on two opposite sides of the groove G, and the metal layer 210 and an inorganic insulating layer, for example, the second interlayer insulating layer 207, directly contact each other through the opening 209OD and thus constitute an inorganic contact region ICR, the above-described moisture infiltration may be prevented.

The groove G may have an undercut structure. The ends of the inorganic layer 210 that protrude toward the center of the groove G and/or the first hole 210h may constitute a pair of eaves (or a pair of protruding tips, or tips PT). A protruding length d1 of each tip PT may be about 1 μm to about 1.5 μm.

Referring to FIG. 11B, the intermediate layer 222, the opposite electrode 223, and the capping layer 230 may be sequentially formed over the substrate 100 in which the grooves G are formed. A portion of the intermediate layer 222, for example, the first functional layer 222a and/or the second functional layer 222c, may be disconnected or broken up by the grooves G in the middle area MA. Similarly, the opposite electrode 223 and the capping layer 230 may be disconnected or broken up in the middle area MA. According to some example embodiments, the capping layer 230 may be omitted or the capping layer 230 including an inorganic insulating layer may be continuously formed as described above with reference to FIG. 9C. Next, the thin-film encapsulation layer 300 is formed.

A partition wall PW may be arranged between the grooves G, and arrangement of an end of the organic encapsulation layer 320 to be adjacent to one side of the partition wall PW adjacent to the display area DA, and inclusion of elements such as the first inorganic encapsulation layer 310 and the second inorganic encapsulation layer 330 in the display panel 10-3 are the same as those described above with reference to FIGS. 8A through 9D.

Also in the present embodiment, the metal layer 216G1 includes the same material as that included in the upper electrode CE2 of the storage capacitor Cst, and is formed on the same layer as the layer on which the upper electrode CE2 of the storage capacitor Cst is formed. Similarly, the metal layer 216G1 may effectively prevent a portion of the middle area MA not covered by the inorganic layer 210, including the grooves G, from being visually recognized by a user.

FIGS. 12A through 12F are cross-sectional views of a method of manufacturing a display panel 10-4 according to another embodiment.

Figure 12A:
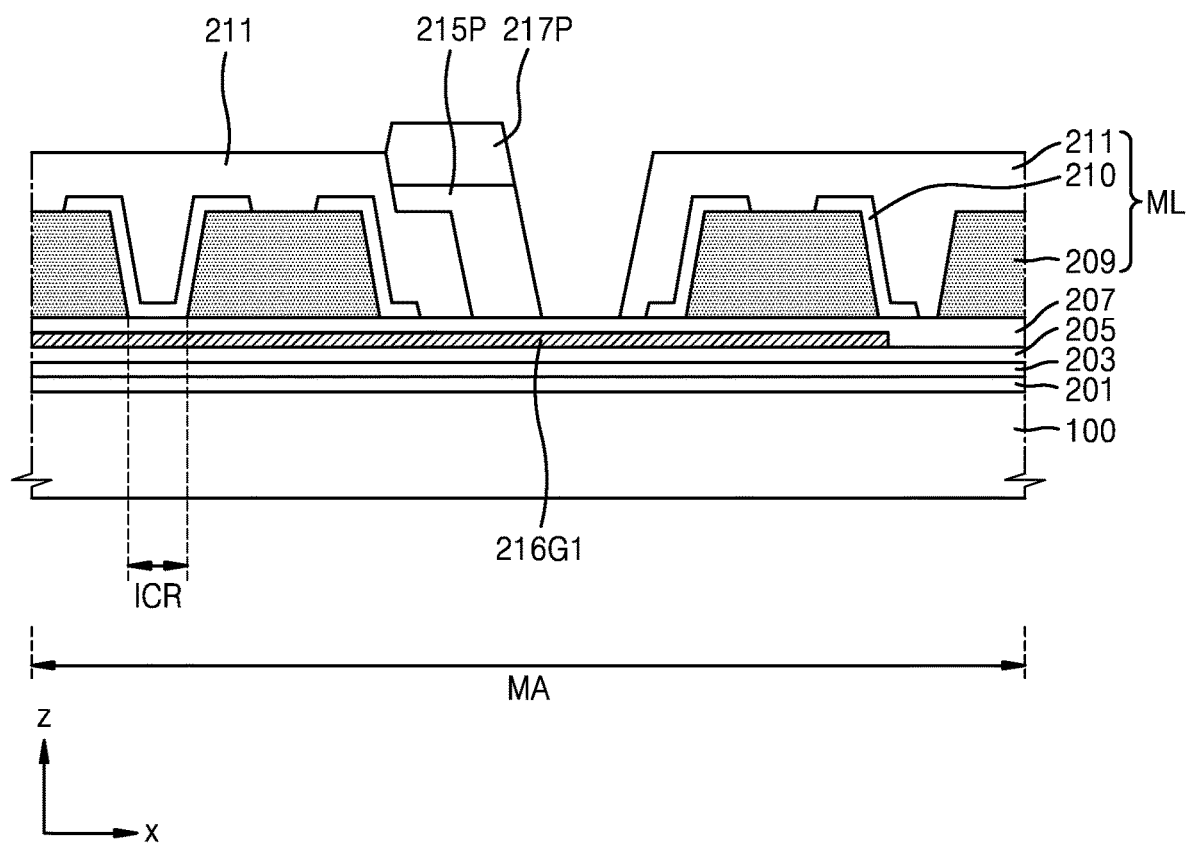
FIGS. 12A through 12F are cross-sectional views of a method of manufacturing a display panel according to some example embodiments.

Referring to FIG. 12A, the multi-layered film M may include the first sub-layer, which is an organic layer, the second sub-layer located on the first sub-layer and including an inorganic layer, and at least one top insulating layer (or a fourth sub-layer) located on the second sub-layer, and the at least one top insulating layer may include an organic insulating layer, an inorganic insulating layer, or both an organic insulating layer and an inorganic insulating layer.

Figure 12B:
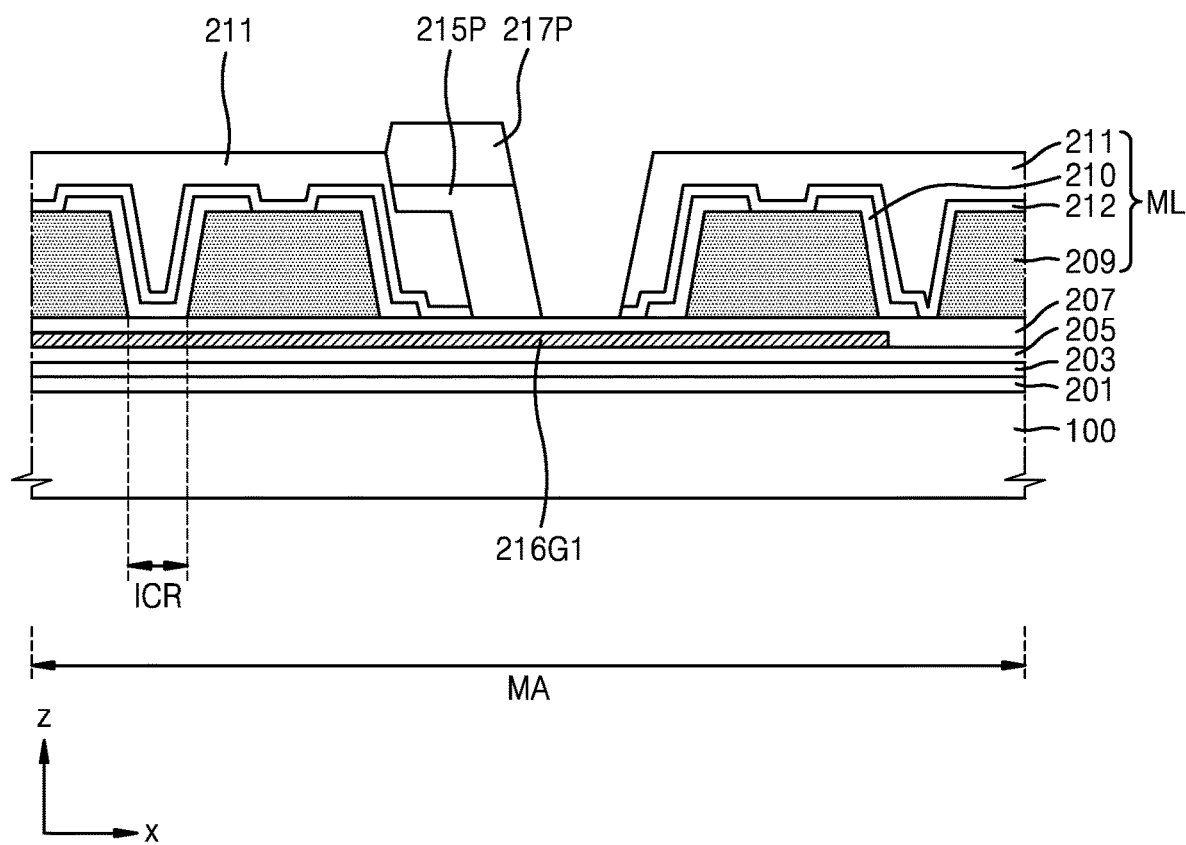
Figure 12C:
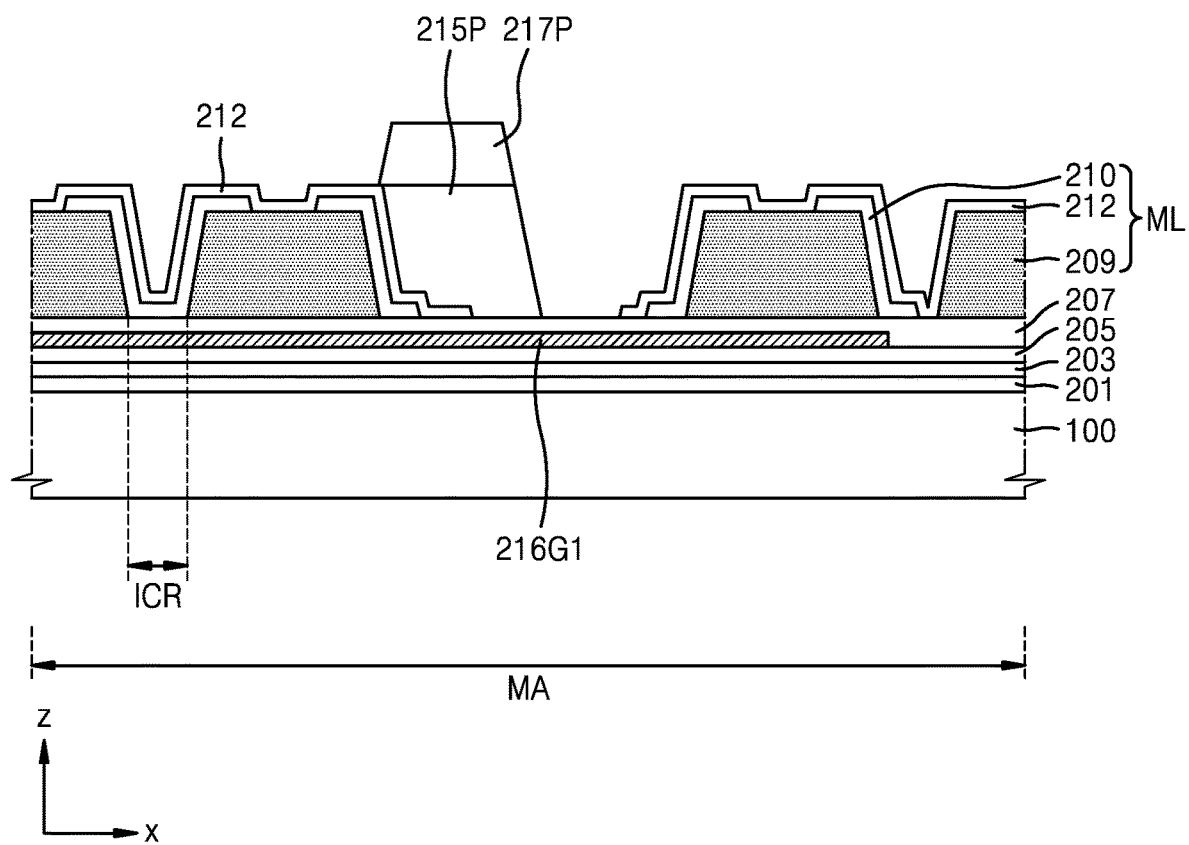
Figure 12D:
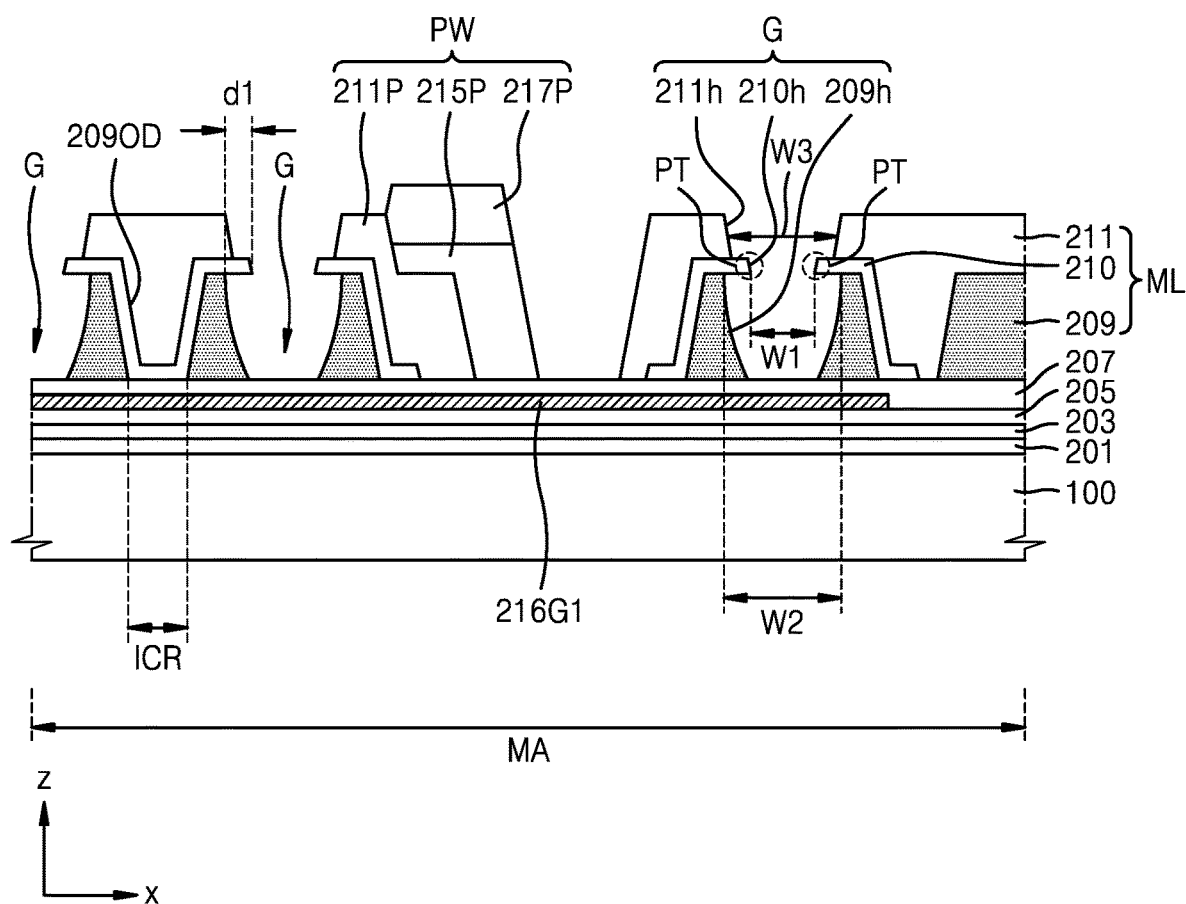

According to some example embodiments, as shown in FIGS. 12A and 12D, the multi-layered film ML may include the first organic insulating layer 209, the inorganic layer 210 on the first organic insulating layer 209, and the second organic insulating layer 211 on the inorganic layer 210. As described above, the inorganic layer 210 may be located on the same layer as a layer on which the contact metal layer CM is arranged and may include the same material as that of the contact metal layer CM.

Figure 12E:
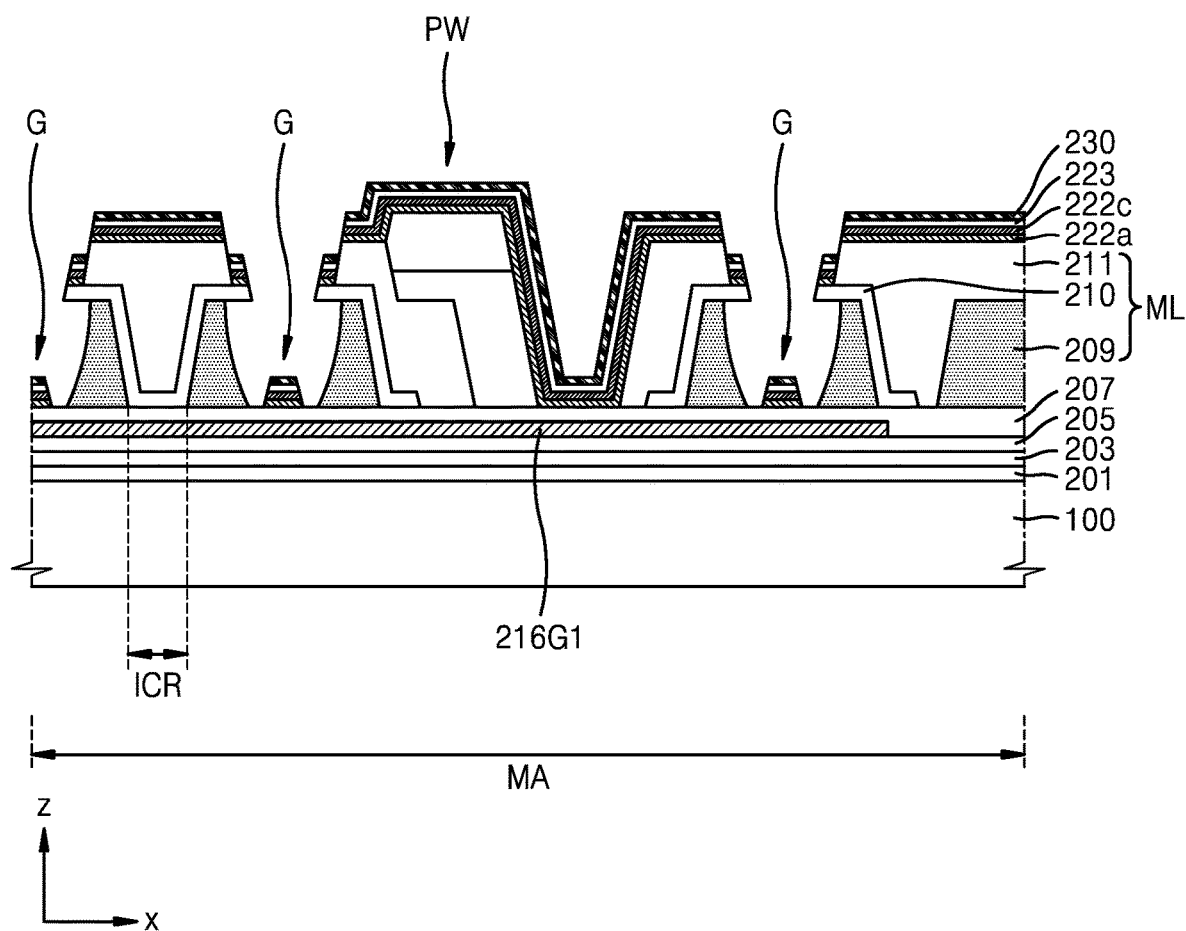
Figure 12F:
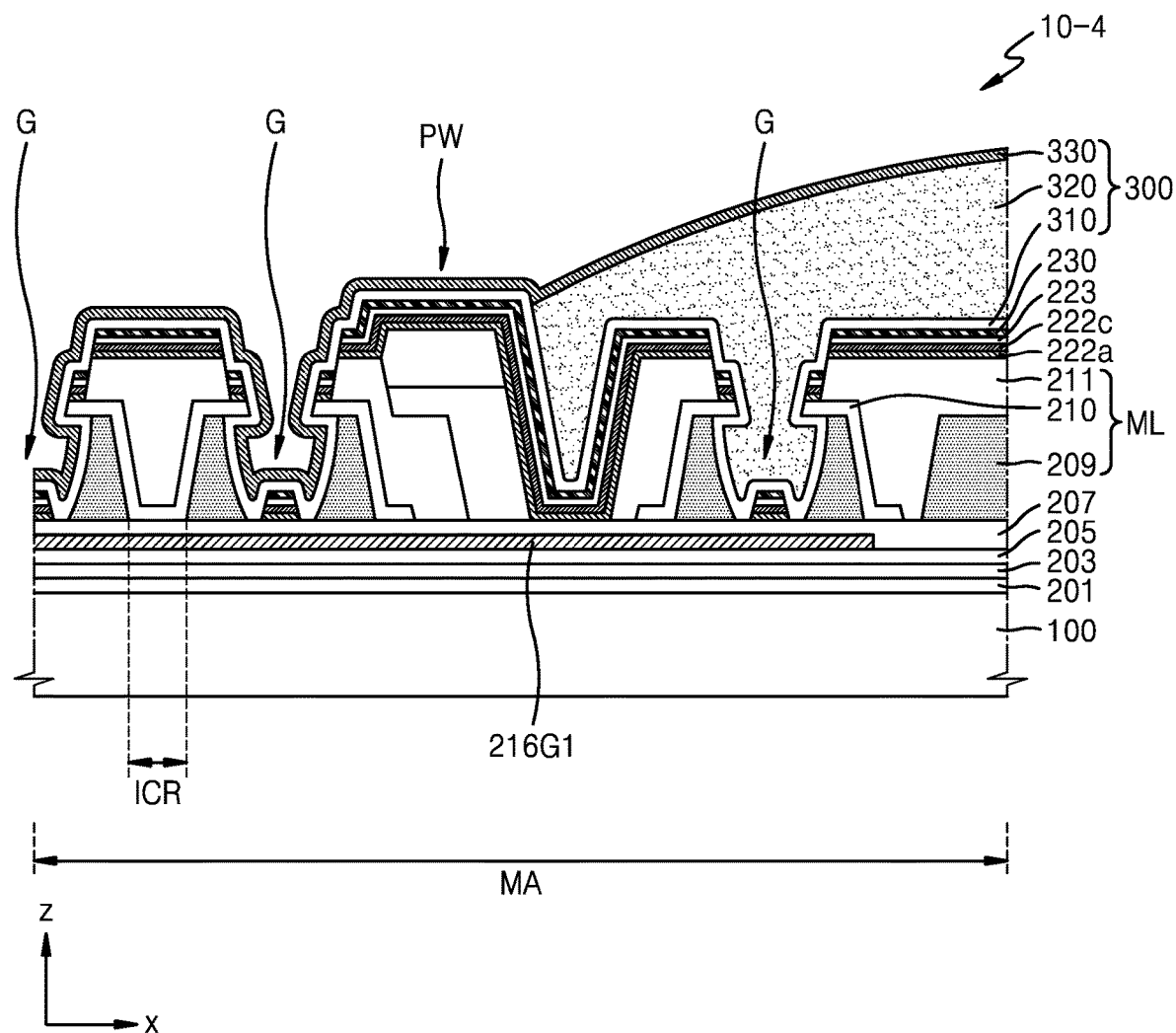

According to some example embodiments, as shown in FIG. 12B, the at least one top insulating layer may include an inorganic insulating layer 212 and the second organic insulating layer 211. Therefore, the multi-layered film ML may include the first organic insulating layer 209, the inorganic layer 210, the inorganic insulating layer 212, and the second organic insulating layer 211 that are sequentially stacked. According to some example embodiments, as shown in FIG. 12C, at least one top insulating layer may include the inorganic insulating layer 212. In this case, the multi-layered film ML may include the first organic insulating layer 209, the inorganic layer 210, and the inorganic insulating layer 212 that are sequentially stacked. Hereinafter, a case in which at least one top insulating layer includes the second organic insulating layer 211 will be described, and features and structures to be described later with reference to FIGS. 12C through 12F are equally applicable to the cases of the at least one top insulating layers described above with reference to FIGS. 12B and 12C.

The grooves G may be formed via etching (e.g., isotropic etching, etc.). As shown in FIG. 12D, the first hole 210h of the inorganic layer 210, the second hole 209h of the first organic insulating layer 209, and a fifth hole 211h of the second organic insulating layer 211 that overlap one another may constitute each groove G. Characteristics of a protruding length d1 of each of a pair of tips PT extending toward the center of the groove G, the first width W1 of the first hole 210h of the inorganic layer 210, and a width (e.g. the second width W2) of a portion of the groove G that passes through the first organic insulating layer 209 are the same as those described above. A lateral surface of the second organic insulating layer 211 that defines the fifth hole 211h may not protrude further toward the center of the groove G than the pair of tips PT. In other words, a width W3 (hereinafter, referred to as a third width) of a bottom surface of the fifth hole 211h may be equal to or greater than the first width W1 of the first hole 210h of the inorganic layer 210.

Referring to FIGS. 12A through 12D, a top insulating layer, for example, the inorganic insulating layer 212 and/or the second organic insulating layer 211 shown in FIGS. 12A through 12C, may cover the ends of the inorganic layer 210 corresponding to the tips PT (see FIG. 12D) before an etching process of forming the grooves G. Therefore, the ends of the inorganic layer 210 that correspond to the tips PT may be prevented from being damaged during a process of manufacturing the display panel 10-4.

The partition wall PW may be adjacent to the grooves G. For example, the partition wall PW may be located between neighboring grooves G. The partition wall PW may be formed while a portion 211P of the second organic insulating layer 211, a portion 215P of the pixel-defining layer 215, and a portion 217P of the spacer 217 are stacked. A portion of the inorganic layer 210 located under the portion 211P of the second organic insulating layer 211 may also constitute the partition wall PW.

The first organic insulating layer 209 may include the opening 209OD. The inorganic layer 210 and the second interlayer insulating layer 207 under the first organic insulating layer 209 may directly contact each other through the opening 209OD, thereby constituting an inorganic contact region ICR.

Referring to FIG. 12E, the intermediate layer 222, the opposite electrode 223, and the capping layer 230 may be sequentially formed over the substrate 100 in which the grooves G are formed. The first functional layer 222a, the second functional layer 222c, the opposite electrode 223, and the capping layer 230 may each be disconnected or broken up in the middle area MA by the grooves G. According to some example embodiments, the capping layer 230 may be omitted or continuously formed without disconnection by the grooves G as described with reference to FIG. 9C.

Referring to FIG. 12F, the thin-film encapsulation layer 300 is formed. For example, the first inorganic encapsulation layer 310, the organic encapsulation layer 320, and the second inorganic encapsulation layer 330 may be sequentially formed. Because the first inorganic encapsulation layer 310 and the second inorganic encapsulation layer 330 have relatively excellent step coverage, the first inorganic encapsulation layer 310 and the second inorganic encapsulation layer 330 may cover entire inner surfaces of the grooves G. An end of the organic encapsulation layer 320 may be adjacent to one lateral surface of the partition wall PW.

Also in the present embodiment, the metal layer 216G1 includes the same material as that included in the upper electrode CE2 of the storage capacitor Cst, and is formed on the same layer as the layer on which the upper electrode CE2 of the storage capacitor Cst is formed. Similarly, the metal layer 216G1 may effectively prevent a portion of the middle area MA not covered by the inorganic contact region ICR, including the grooves G, from being visually recognized by a user.

Figure 13:
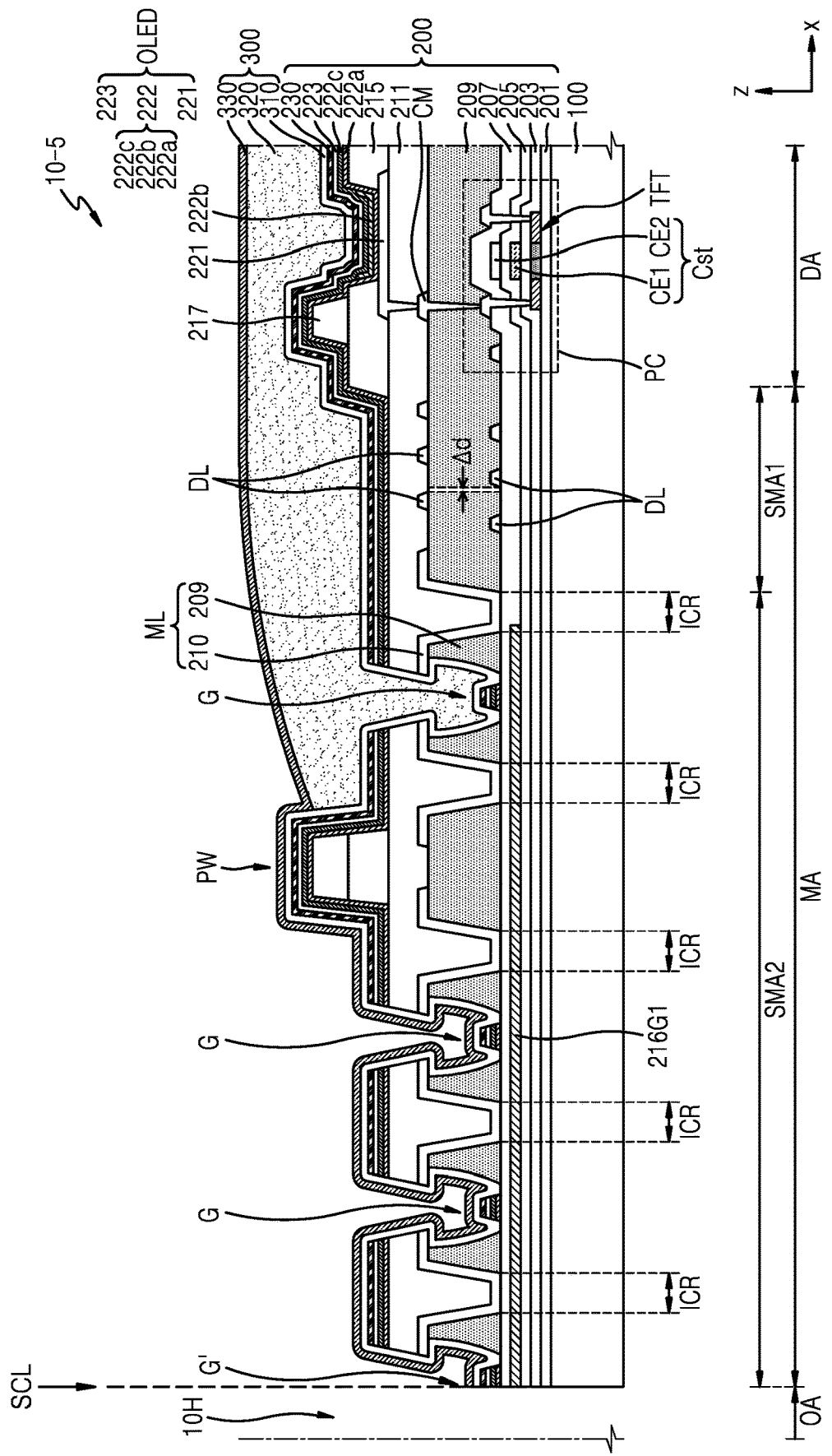
FIG. 13 is a schematic cross-sectional view of a middle area of a display panel according to some example embodiments.

FIG. 13 is a schematic cross-sectional view of a display panel 10-5 according to another embodiment.

Referring to FIG. 13, in the display panel 10-5, characteristics of other elements excluding the grooves G arranged in the middle area MA are substantially the same as those of the display panel 10-1 described with reference to FIG. 8A.

The display panel 10-5 may include three or more grooves G arranged in the middle area MA. An inorganic contact region ICR may be arranged between neighboring grooves G. The first functional layer 222a, the second functional layer 222c, the opposite electrode 223, and/or the capping layer 230 may each be disconnected by each groove G. Although it is shown in FIG. 13 that the grooves G and the inorganic contact region ICR have substantially the same structures as those described above with reference to FIGS. 8A through 9D, the disclosure is not limited thereto. According to some example embodiments, the grooves G, the partition wall PW, and/or the inorganic contact region ICR may have the same structures as those of the embodiment(s) described above with reference to FIGS. 10A through 12F or structures derived therefrom.

The display panel 10-5 may include the first opening 10H located in the first area OA. The first opening 10H may be formed by removing elements located in the first area OA by using a scribing or cutting process. The scribing or cutting process may be performed along a first line SCL1, and FIG. 13 shows the display panel 10-5 manufactured by performing the scribing or cutting process, etc. along the first line SCL1.

The first line SCL1 may pass through one groove G' among the grooves G. In this case, a stacked body including the first functional layer 222a, the second functional layer 222c, the opposite electrode 223, and/or the capping layer 230 each disconnected by the groove G' may face the first opening 10H. According to some example embodiments, the first line SCL1 may be located between two neighboring grooves G among the grooves G. In this case, a lateral surface of the display panel that defines the first opening 10H may be the same as that shown in FIG. 8A. For example, as shown in FIG. 8A, a structure located in the inorganic contact region ICR may face the first opening 10H.

Also in the present embodiment, the metal layer 216G1 includes the same material as that included in the upper electrode CE2 of the storage capacitor Cst, and is formed on the same layer as the layer on which the upper electrode CE2 of the storage capacitor Cst is formed. Similarly, the metal layer 216G1 may effectively prevent a portion of the middle area MA not covered by the inorganic layer 210, including the grooves G, from being visually recognized by a user.

Figure 14A:
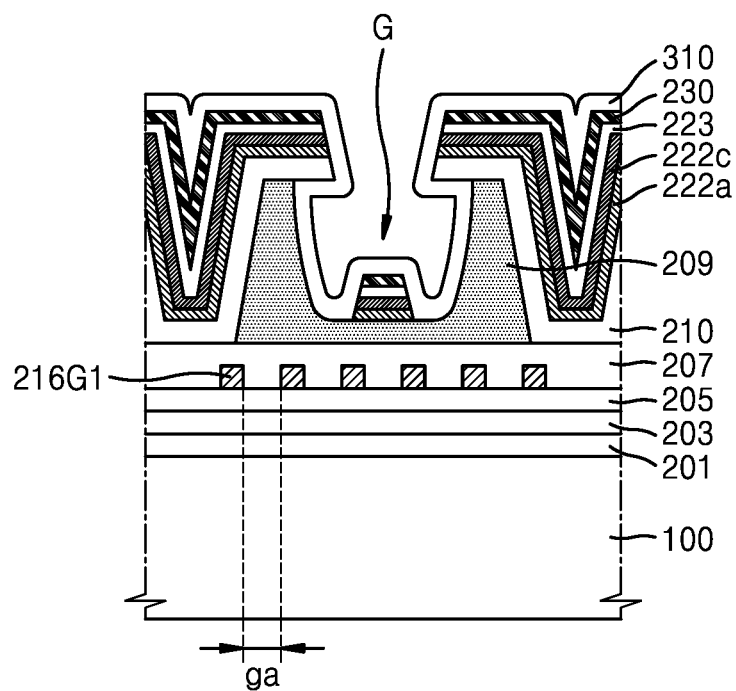
FIGS. 14A and 14B are cross-sectional views of modifiable examples of a metal layer provided in a middle area of a display panel, according to some example embodiments.
Figure 14B:
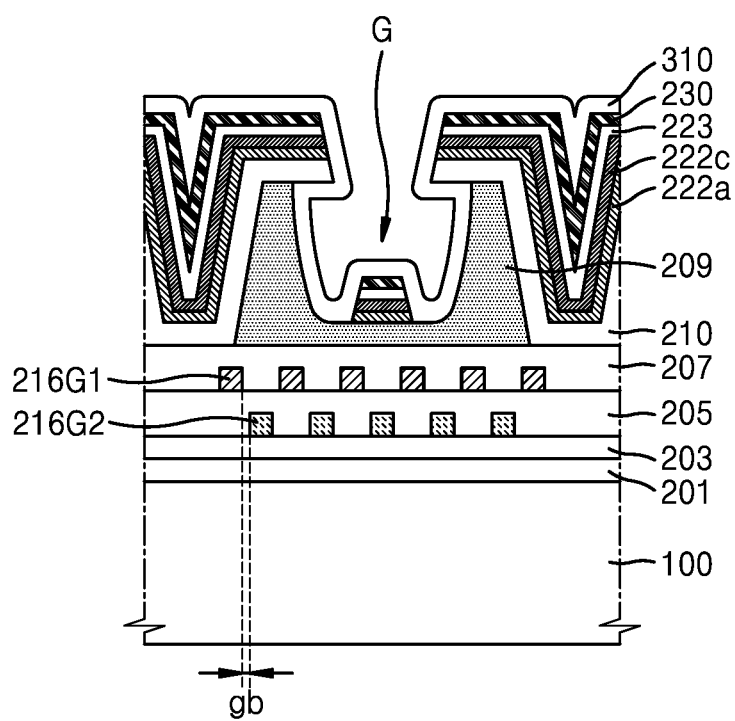

The above-described embodiments illustrate a case where the metal layers 216G1 and 216G2 are continuous layers extending without disconnection on one layer. However, as shown in FIGS. 14A and 14B, the metal layers 216G1 and 216G2 may be divided layers having gaps ga and gb therein. FIG. 14A illustrates a single-layered structure in which a divided metal layer 216G1 is on one layer, and FIG. 14B illustrates a multi-layered structure in which divided metal layers 216G1 and 216G2 are on different layers such that portions of the divided metal layer 216G1 alternate with portions of the divided metal layer 216G2. The single-layered structure of FIG. 14A may include the segmented metal layer 216G2 that is on the same layer as the layer on which the lower electrode is formed.

Because the segmented metal layers 216G1 and 216G2 are members for covering a portion of a display panel where a metal layer is empty, when there are such gaps ga and gb, reflected light may be visually recognized by a user. However, when the gaps ga and gb are very small, reflected light may not be recognized by the eyes of a user. In general, when the gaps ga and gb are 3 μm or less, reflected light is not recognized by the eyes of a user. Therefore, it is not necessary to make the metal layers 216G1 and 216G2 as continuous layers, and, as shown in FIGS. 14A and 14B, the metal layers 216G1 and 216G2 may be segmented layers having gaps ga and gb as long as reflected light is not recognized by the eyes of a user.

Figure 15:
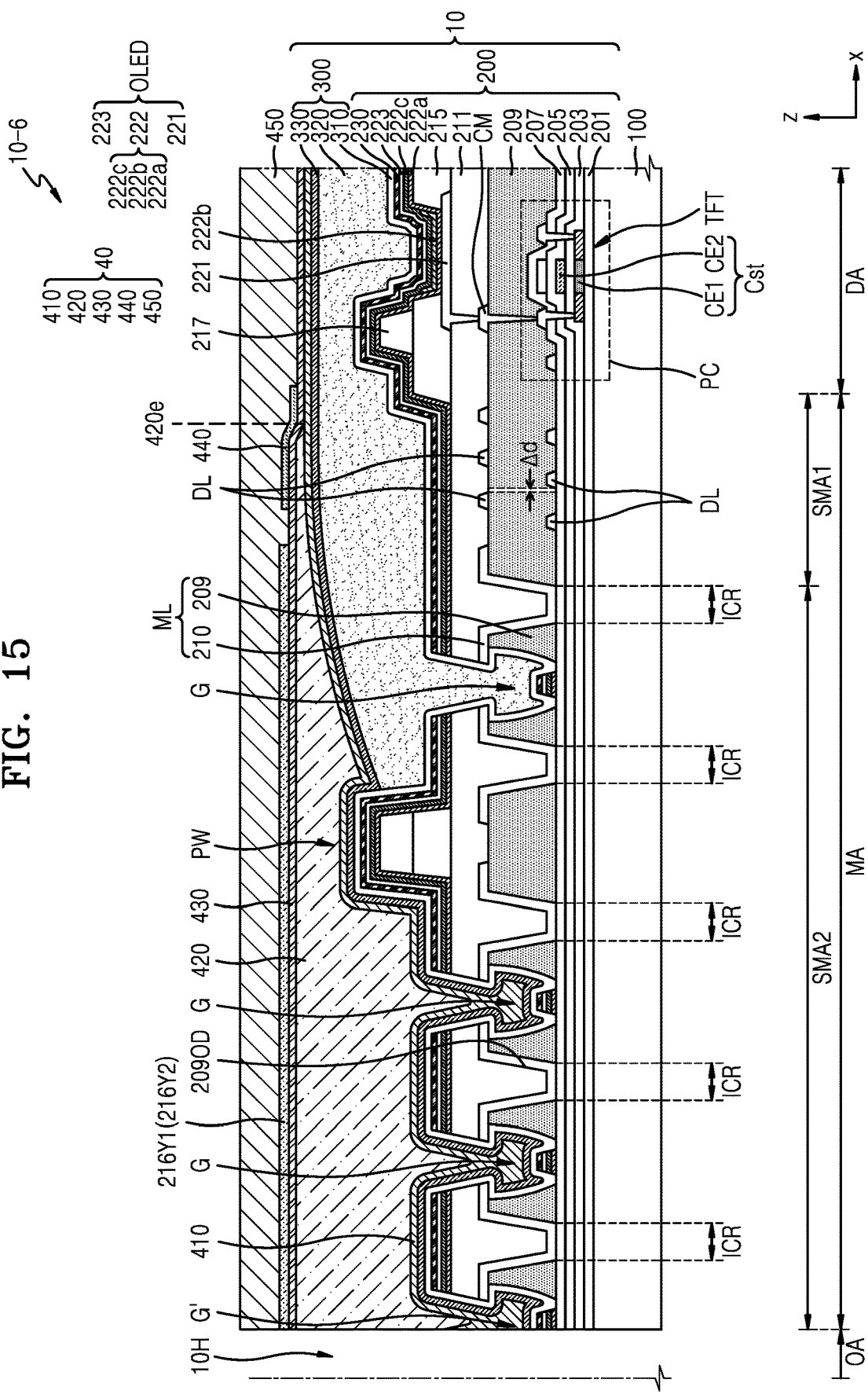
FIG. 15 is a schematic cross-sectional view of a display apparatus including a metal layer in an input sensing layer, according to some example embodiments.

FIG. 15 is a schematic cross-sectional view of a display panel 10-6 according to another embodiment.

Referring to FIG. 15, the display panel 10-6 may include a planarization layer 420 arranged over the thin-film encapsulation layer 300 and located in the middle area MA. According to some example embodiments, the planarization layer 420 may be arranged in only the middle area MA.

The planarization layer 420 may include an organic insulating layer. The planarization layer 420 may include a polymer-based material. For example, the planarization layer 420 may include silicon-based resin, acrylic resin, epoxy-based resin, polyimide, and polyethylene. According to some example embodiments, the planarization layer 420 may include a material different from that of the organic encapsulation layer 320.

The planarization layer 420 may cover at least one groove G located in the middle area MA. The planarization layer 420 may increase flatness of the display panel 10-6 around the first area OA by covering a region that is not covered by the organic encapsulation layer 320 in the middle area MA. Therefore, separation or floating issue of the input sensing layer 40 (see FIGS. 2A and 2B) and/or the optical functional layer 50 (see FIGS. 2A and 2B) on the display panel 10-6 10-14 may be prevented. A portion of the planarization layer 420 may overlap the organic encapsulation layer 320. One end of the planarization layer 420, for example, a first end 420e adjacent to the display area DA, may be located over the organic encapsulation layer 320.

The planarization layer 420 may be formed in the middle area MA through exposure and development processes, etc. During some (e.g. a washing process) of the processes for forming the planarization layer 420, when external foreign substance, for example, moisture, progresses in a lateral direction of the display panel 10-6, the organic light-emitting diode OLED in the display area DA may be damaged. However, according to embodiments, because insulating layers, for example, a first insulating layer 410 and a second insulating layer 430, are respectively arranged under and over the planarization layer 420, the above-described issue due to moisture penetration and/or floating of a neighboring layer may be prevented during and after a process of forming the planarization layer 420.

The first insulating layer 410 and the second insulating layer 430 may respectively directly contact a bottom surface and a top surface of the planarization layer 420. The first insulating layer 410 and the second insulating layer 430 may each include an inorganic insulating material, such as silicon oxide, silicon nitride, or silicon oxynitride. Each of the first insulating layer 410 and the second insulating layer 430 may be a single layer or multi-layer including the aforementioned materials.

The planarization layer 420 may have a step difference with respect to layer(s) therebelow. A portion of the planarization layer 420 that includes the first end 420e may have a step difference with respect to a top surface of the first insulating layer 410. During and/or after a process of manufacturing the display panel 10-6, to prevent separation or floating of the planarization layer 420 from a layer therebelow due to the step difference, a cover layer 440 may be located over the first end 420*e*.

The cover layer 440 may include a metal. Each of the first insulating layer 410, the second insulating layer 430, and a third insulating layer 450 described below extends to not only the middle area MA but also the display area DA. In contrast, the cover layer 440 may have a predetermined width and cover the first end 420*e* of the planarization layer 420. The cover layer 440 over the planarization layer 420 may extend toward the display area DA beyond the first end 420*e* of the planarization layer 420, but does not extend toward the display area DA.

The third insulating layer 450 may be located on the cover layer 440. The third insulating layer 450 may include an organic insulating material. For example, the organic insulating material of the third insulating layer 450 may include a photoresist (a negative or positive photoresist) or a polymer-based organic material, and may extend toward the display area DA to cover the display area DA.

Figure 16:
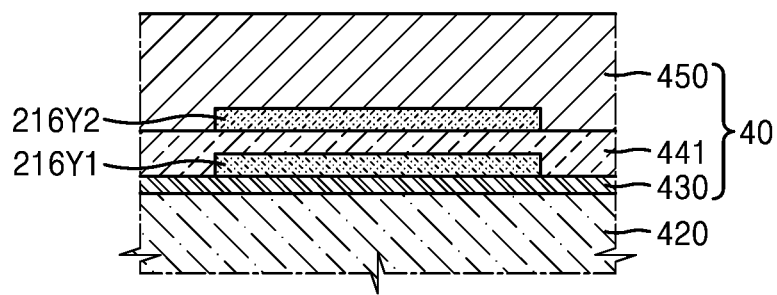
FIG. 16 is a cross-sectional view of a layout of an upper sensing electrode and a lower sensing electrode of an input sensing layer illustrated in FIG. 15.

A portion above the second insulating layer 430 may correspond to the input sensing layer 40. In other words, as shown in FIG. 16, the input sensing layer 40 includes a lower sensing electrode 216Y1 on the second insulating layer 430, and an upper sensing electrode 216Y2 between the second insulating layer 430 and an interlayer insulating layer 441, and functions as a touch screen that senses a touch of a user and transmits a signal to the display panel 10.

According to the present embodiment, one of the lower sensing electrode 216Y1 and the upper sensing electrode 216Y2 serves as a metal layer that covers the grooves G. In other words, as shown in FIG. 15, one of the lower sensing electrode 216Y1 and the upper sensing electrode 216Y2 may prevent visual recognition of the inside of the display panel 10 by covering the grooves G from above. Therefore, according to the above-described embodiments, the metal layers 216G1 and 216G2 are arranged under the grooves G. According to the present embodiment, the lower and upper sensing electrodes 216Y1 and 216Y2 serving as metal layers are arranged over the grooves G. In this case, because the lower and upper sensing electrodes 216Y1 and 216Y2 cover the grooves G to prevent visual recognition of the grooves G, the inside of a display panel may be prevented from being visually recognized by a user.

Figure 17A:
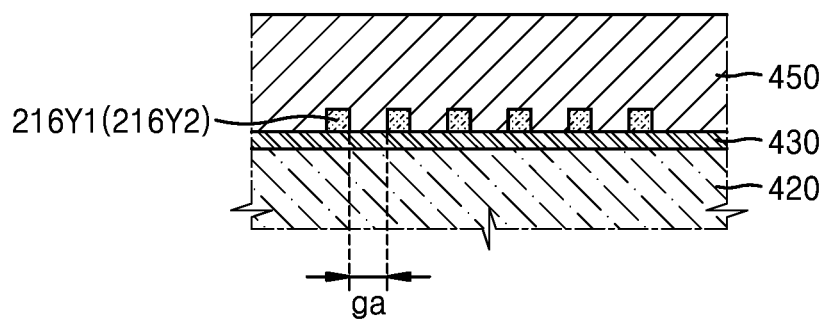
FIGS. 17A and 17B are cross-sectional views of modifiable examples of the metal layer provided in the input sensing layer illustrated in FIG. 15, according to some example embodiments.
Figure 17B:
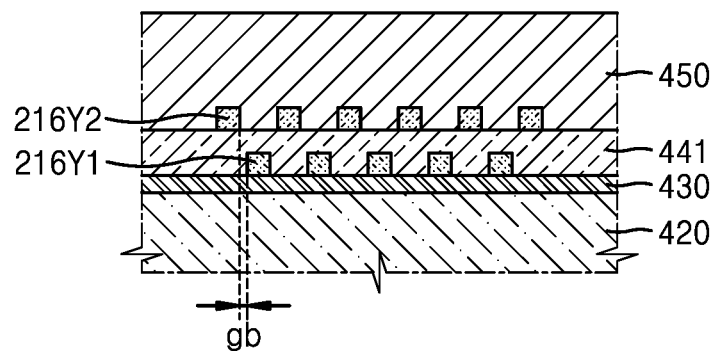

Furthermore, the present embodiment illustrates a case where the lower and upper sensing electrodes 216Y1 and 216Y2 (hereinafter, referred to as metal layers 216Y1 and 216Y2) are continuous layers extending without disconnection on one layer. However, as shown in FIGS. 17A and 17B, the metal layers 216Y1 and 216Y2 may be divided layers having gaps ga and gb in the middle thereof. FIG. 17A illustrates a single-layered structure in which a divided metal layer 216Y1 or 216Y2 is on one layer, and FIG. 17B illustrates a multi-layered structure in which divided metal layers 216Y1 and 216Y2 are on different layers such that the divided metal layer 216Y1 alternates with he divided metal layer 216Y2.

Even when the gaps ga and gb of the segmented metal layers 216Y1 and 216Y2 are 3 µm or less, the inside of a display panel is prevented from being visually recognized by a user. Therefore, it is not necessary to make the metal layers 216Y1 and 216Y2 as continuous layers, and, as shown in FIGS. 17A and 17B, the metal layers 216Y1 and 216Y2 may be divided layers having gaps ga and gb as long as reflected light is not visible through the eyes of a user.

The metal layers 216G1, 216G2, 216Y1, and 216Y2 according to the above-described embodiments may be non-driving metal layers that are not used as wiring, or may be driving metal layers that are used as wiring.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
   a display panel comprising a transmission area, a display area, and a middle area that includes at least one groove and is located between the transmission area and the display area, the display area at least partially surrounding the transmission area and the middle area; and
   an input sensing layer stacked on the display panel,
   wherein a metal layer that overlaps the at least one groove in a plan view is in one of the display panel and the input sensing layer.

2. The display apparatus of claim 1, wherein
   a thin-film transistor and a storage capacitor are included in the display area, the thin-film transistor including a semiconductor layer, a gate electrode, a source electrode, and a drain electrode and being connected to a display element, and the storage capacitor comprising a lower electrode and an upper electrode facing each other with an insulating layer therebetween, wherein the gate electrode is used as the lower electrode, and
   the metal layer comprises a material which is the same as a material included in one of the gate electrode and the upper electrode and is arranged on a same layer as a layer on which one of the gate electrode and the upper electrode is arranged.

3. The display apparatus of claim 2, wherein the metal layer is a continuous layer extending without disconnection.

4. The display apparatus of claim 2, wherein the metal layer is a divided layer having gaps of 3 µm or less in a plan view.

5. The display apparatus of claim 4, wherein
   the divided layer comprises a single-layered divided layer on a same layer as the layer on which one of the gate electrode and the upper electrode is arranged, or a multi-layered divided layer in which multiple layers are on different layers such that portions of one layer alternate with portions of another layer with the gaps therebetween.

6. The display apparatus of claim 1, wherein the input sensing layer comprises a lower sensing electrode and an upper sensing electrode facing each other with an insulating layer therebetween, and
   the metal layer comprises a material which is the same as a material included in one of the lower sensing electrode and the upper sensing electrode, and is arranged on a same layer as a layer on which one of the lower sensing electrode and the upper sensing electrode is arranged.

7. The display apparatus of claim 6, wherein the metal layer is a continuous layer extending without disconnection.

8. The display apparatus of claim 6, wherein the metal layer is a divided layer having gaps of 3 µm or less in a plan view.

9. The display apparatus of claim 8, wherein
the divided layer comprises a single-layered divided layer on a same layer as the layer on which one of the lower sensing electrode and the upper sensing electrode is arranged, or a multi-layered divided layer in which multiple layers are on different layers such that portions of one layer alternate with portions of another layer with the gaps therebetween.

10. The display apparatus of claim 1,
further comprising a window that covers the display panel and the input sensing layer from outside; and an optical functional layer between the display panel and the window.

11. The display apparatus of claim 10, wherein
the optical functional layer comprises an anti-reflection layer using polarization, and
a black matrix for blocking light is not located in a portion of the window that corresponds to the middle area.

12. The display apparatus of claim 1, wherein
the display area comprises, on a substrate, a display element in which a pixel electrode, an intermediate layer including an emission layer, and an opposite electrode are stacked, and a multi-layered film in which an inorganic insulating layer, an organic insulating layer, and an inorganic layer are sequentially stacked between the substrate and the pixel electrode, and
the middle area comprises an inorganic contact region where the inorganic layer and the inorganic insulating layer directly contact each other through an opening which is included in the organic insulating layer and is adjacent to each of the at least one groove.

13. The display apparatus of claim 12, wherein
the inorganic layer is arranged to not overlap each of the at least one groove in a plan view, and
the metal layer covers a portion of the middle area not covered by the inorganic layer in a plan view, including each of the at least one groove.

14. The display apparatus of claim 12, wherein
each of the at least one groove comprises:
a first hole passing through the inorganic layer; and
a second hole or a recess that passes through the organic insulating layer.

15. The display apparatus of claim 12, wherein
the multi-layered film further comprises a lower insulating layer under the organic insulating layer, and
each of the at least one groove comprises:
a first hole that passes through the inorganic layer;
a second hole that passes through the organic insulating layer; and
a third hole or a recess that passes through the lower insulating layer.

16. The display apparatus of claim 12, wherein
the multi-layered film further comprises at least one upper insulating layer over the organic insulating layer, and
the at least one upper insulating layer comprises a hole that overlaps each of the at least one groove.

17. The display apparatus of claim 16, wherein
the at least one upper insulating layer comprises an inorganic insulating layer and/or an organic insulating layer.

18. The display apparatus of claim 12, wherein
the intermediate layer comprises one or more organic material layers from among a hole transport layer, a hole injection layer, an electron injection layer, an electron transport layer.

19. The display apparatus of claim 12, wherein
the at least one groove comprises a plurality of grooves spaced apart from each other, and the inorganic contact region is between the plurality of grooves.

20. The display apparatus of claim 1, wherein each of the at least one groove has an undercut structure.

* * * * *